US012658973B2

(12) United States Patent
Xu

(10) Patent No.: US 12,658,973 B2
(45) Date of Patent: Jun. 16, 2026

(54) LIGHT-EMITTING SUBSTRATE AND LIGHT-EMITTING APPARATUS

(71) Applicant: BOE TECHNOLOGY GROUP CO., LTD., Beijing (CN)

(72) Inventor: Rui Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 348 days.

(21) Appl. No.: 18/686,011

(22) PCT Filed: Feb. 23, 2023

(86) PCT No.: PCT/CN2023/077976
§ 371 (c)(1),
(2) Date: Feb. 23, 2024

(87) PCT Pub. No.: WO2024/174180
PCT Pub. Date: Aug. 29, 2024

(65) Prior Publication Data
US 2025/0192823 A1 Jun. 12, 2025

(51) Int. Cl.
*H04B 5/43* (2024.01)
*H04B 5/26* (2024.01)
(Continued)

(52) U.S. Cl.
CPC ................ *H04B 5/43* (2024.01); *H04B 5/26* (2024.01); *H10H 29/49* (2025.01); *H10H 29/8322* (2025.01); *H10W 90/00* (2026.01)

(58) Field of Classification Search
CPC .......... H04B 10/0795; H04B 10/07953; H04B 10/07955; H04B 10/0797; H04B 10/0799;
(Continued)

(56) References Cited

U.S. PATENT DOCUMENTS

| | | | |
|---|---|---|---|
| 11,394,428 B2 | 7/2022 | Keitel-Schulz et al. | |
| 2004/0085247 A1* | 5/2004 | Mickle ................... | H01Q 1/248 |
| | | | 343/701 |

(Continued)

FOREIGN PATENT DOCUMENTS

| | | |
|---|---|---|
| CN | 101311780 A | 11/2008 |
| CN | 106532326 A | 3/2017 |

(Continued)

*Primary Examiner* — Ajibola A Akinyemi
(74) *Attorney, Agent, or Firm* — The Webb Law Firm

(57) ABSTRACT

A light-emitting substrate includes a first conductive coil, a light-emitting unit and a control circuit. The first conductive coil has a first end and a second end. The first conductive coil is coupled to an external coil, so that the first conductive coil generates a first power signal. The light-emitting unit includes a first electrode and a second electrode. The second electrode of the light-emitting unit is electrically connected to the first end of the first conductive coil. A control terminal of the control circuit is electrically connected to the second end of the first conductive coil, an input terminal of the control circuit is electrically connected to a first power terminal, and an output terminal of the control circuit is electrically connected to the first electrode of the light-emitting unit. The first voltage signal provided by the first power terminal is a direct current voltage signal.

20 Claims, 7 Drawing Sheets

A-A'

(51) Int. Cl.
    *H10H 29/49*        (2025.01)
    *H10H 29/80*        (2025.01)
    *H10W 90/00*        (2026.01)

(58) Field of Classification Search
    CPC .. H04B 10/40; H04B 10/5057; H04B 10/506;
              H04B 10/564; H04B 10/07; H04B 5/26;
              H04B 5/43; H04B 5/79; H04B 7/0413
    USPC ....................................................... 455/41.1
    See application file for complete search history.

(56)                  References Cited

U.S. PATENT DOCUMENTS

| | | | | |
|---|---|---|---|---|
| 2020/0276761 A1* | 9/2020 | Nishida | ................ | G02B 26/105 |
| 2022/0053615 A1* | 2/2022 | Hao | ......................... | G09G 3/32 |

FOREIGN PATENT DOCUMENTS

| | | |
|---|---|---|
| CN | 105810149 B | 12/2019 |
| CN | 114340091 A | 4/2022 |
| JP | H0993810 A | 4/1997 |

* cited by examiner

200

100

D-Dé

A-A'

H-H'

H-H'

LIGHT-EMITTING SUBSTRATE AND LIGHT-EMITTING APPARATUS

CROSS-REFERENCE TO RELATED APPLICATION

This application is the United States national phase of International Patent Application No. PCT/CN2023/077976, filed Feb. 23, 2023, the disclosure of which is hereby incorporated by reference in its entirety.

BACKGROUND OF THE INVENTION

Field of the Invention

The present disclosure relates to the field of display technologies, and in particular, to a light-emitting substrate and a light-emitting apparatus.

Description of Related Art

Near field communication (NFC) is an emerging technology; apparatuses (e.g., mobile phones) using NFC technology may exchange data when they are close to each other. Based on this, NFC may be widely used in payment, security, tags, and the like.

SUMMARY OF THE INVENTION

In an aspect, a light-emitting substrate is provided. The light-emitting substrate includes a first conductive coil, a light-emitting unit and a control circuit. The first conductive coil has a first end and a second end. The first conductive coil is used to couple to an external coil, so that the first conductive coil generates a first power signal. The light-emitting unit includes a first electrode and a second electrode. The second electrode of the light-emitting unit is electrically connected to the first end of the first conductive coil. A control terminal of the control circuit is electrically connected to the second end of the first conductive coil, an input terminal of the control circuit is electrically connected to a first power terminal, and an output end of the control circuit is electrically connected to the first electrode of the light-emitting unit. A first voltage signal provided by the first power terminal is a direct current voltage signal. The control circuit is configured to transmit the first voltage signal received at the first power terminal to the light-emitting unit under control of the first power signal from the first conductive coil, so that the light-emitting unit emits light.

In some embodiments, the control circuit includes a first control unit and a second control unit. A control terminal of the first control unit and the first conductive coil is electrically connected to a first node, an input terminal of the first control unit is electrically connected to the first power terminal, and an output terminal of the first control unit is electrically connected to a second node. A control terminal of the second control unit and the first conductive coil are electrically connected to the first node, an input terminal of the second control unit is electrically connected to the first power terminal, and an output terminal of the second control unit is electrically connected to the second node. The first node serves as the control terminal of the control circuit, and the second node serves as the output terminal of the control circuit.

In some embodiments, the first control unit includes a P-type transistor, and the second control unit includes an N-type transistor.

In some embodiments, the light-emitting substrate further includes: a base substrate, a first gate metal layer, a first source-drain metal layer, a first electrode metal layer and a second electrode metal layer. The first gate metal layer is located on a side of the base substrate and includes a control electrode of the P-type transistor and a control electrode of the N-type transistor. The first source-drain metal layer is located on a side of the first gate metal layer away from the base substrate. The first source-drain metal layer includes: a first electrode of the P-type transistor, a second electrode of the P-type transistor, a first electrode of the N-type transistor, and a second electrode of the N-type transistor. The first electrode metal layer is located on a side of the first source-drain metal layer away from the base substrate. The second electrode metal layer is located on a side of the first electrode metal layer away from the base substrate. Of the first electrode of the light-emitting unit and the second electrode of the light-emitting unit, one is located in the first electrode metal layer, and another is located in the second electrode metal layer.

In some embodiments, a voltage value of the first voltage signal is greater than 0 V; the first electrode of the light-emitting unit is located in the first electrode metal layer, and the second electrode of the light-emitting unit is located in the second electrode metal layer.

In some embodiments, the voltage value of the first voltage signal is in a range of 2 V to 5 V, inclusive.

In some embodiments, the first electrode metal layer further includes a first connection portion; the first end of the first conductive coil is electrically connected to the second electrode of the light-emitting unit through the first connection portion.

In some embodiments, a voltage value of the first voltage signal is less than 0 V; the first electrode of the light-emitting unit is located in the second electrode metal layer, and the second electrode of the light-emitting unit is located in the first electrode metal layer.

In some embodiments, the voltage value of the first voltage signal is in a range of −5 V to −2 V, inclusive.

In some embodiments, the first electrode metal layer further includes a second connection portion, the second electrode of the P-type transistor and the second electrode of the N-type transistor are electrically connected to the first electrode of the light-emitting unit through the second connection portion.

In some embodiments, the first conductive coil is located in one of the first gate metal layer and the first source-drain metal layer.

In some embodiments, the light-emitting substrate further includes a second conductive coil connected to the first conductive coil in parallel.

In some embodiments, of the first conductive coil and the second conductive coil, one is located in the first source-drain metal layer and another is located in the first gate metal layer.

For example, an orthographic projection of the first conductive coil on the base substrate overlaps at least partially with an orthographic projection of the second conductive coil on the base substrate.

In some embodiments, a thickness of the first conductive coil is greater than or equal to 1 μm.

In some embodiments, a number of turns of the first conductive coil is greater than or equal to 10.

In some embodiments, a line width of the first conductive coil is greater than or equal to 500 μm.

In some embodiments, the first conductive coil includes a plurality of turns of conductive lines, a first minimum distance between two adjacent turns of conductive lines is greater than or equal to 10 μm.

In some embodiments, the light-emitting unit includes a light-emitting diode.

In another aspect, a light-emitting apparatus is provided. The light-emitting apparatus includes the light-emitting substrate according to any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
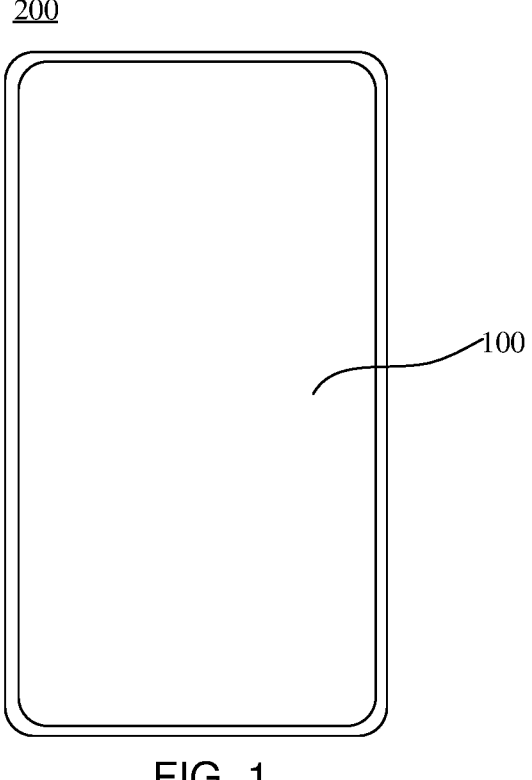
FIG. 1 is a structural diagram of a display apparatus, in accordance with some embodiments.

The technical solutions in embodiments of the present disclosure will be described clearly and completely with reference to the accompanying drawings. Obviously, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

Some embodiments may be described using the terms "coupled" and "connected" and their derivatives. The term "connection" shall be understood in a broad sense. For example, "connection" may be a fixed connection, a detachable connection, or an integrated connection; it may be a direct connection or an indirect connection through an intermediate medium. The embodiments disclosed herein are not necessarily limited to the context herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

As used herein, the term "if", depending on the context, is optionally construed as "when", "in a case where", "in response to determining that" or "in response to detecting". Similarly, depending on the context, the phrase "if it is determined that" or "if [a stated condition or event] is detected" is optionally construed as "in a case where it is determined that", "in response to determining that", "in a case where [the stated condition or event] is detected" or "in response to detecting [the stated condition or event]".

The phase "applicable to" or "configured to" used herein means an open and inclusive expression, which does not exclude devices that are applicable to or configured to perform additional tasks or steps.

In addition, the phrase "based on" used is meant to be open and inclusive, since processes, steps, calculations or other actions "based on" one or more of the stated conditions or values may, in practice, be based on additional conditions or values exceeding those stated.

The term such as "about" or "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

It will be understood that, in a case that a layer or element is referred to be on another layer or substrate, it may be that the layer or element is directly on the another layer or substrate, or it may be that there is an intermediate layer between the layer or element and the another layer or substrate.

The "same layer" mentioned herein refers to a layer structure that is formed by forming a film layer for forming specific patterns by using a same film forming process, and then performing a single patterning process by using a same mask. Depending on different specific patterns, the single patterning process may include multiple exposure, development or etching processes, and the specific patterns in the formed layer structure may be continuous or discontinuous, and these specific patterns may also be at different heights or have different thicknesses.

Exemplary embodiments are described herein with reference to segmental views and/or plan views as idealized exemplary drawings. In the accompanying drawings, thicknesses of layers and areas of regions (areas) are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Transistors used in circuits in the embodiments of the present disclosure may be thin film transistors, field effect transistors or other switching devices with same characteristics, and the thin film transistors are all used as an example in the embodiments of the present disclosure for description.

In thin film transistors employed in circuits provided by the embodiments of the present disclosure, a first electrode of each thin film transistor is one of a source and a drain, and a second electrode of the thin film transistor is the other one of the source and the drain. Since the source and the drain of the transistor may be symmetrical in structure, the source and the drain thereof may be indistinguishable in structure. That is, the first electrode and the second electrode of the transistor in the embodiments of the present disclosure may be indistinguishable in structure.

In the circuit structure provided in the embodiments of the present disclosure, the first node, the second node and the like do not represent actual components, but rather represent junctions of related electrical connections in a circuit diagram. That is, these nodes are nodes equivalent to junctions of relevant electrical connections in the circuit diagram.

FIG. 1 is a structural diagram of a light-emitting apparatus, in accordance with some embodiments.

Some embodiments of the present disclosure provide a light-emitting apparatus 200. As shown in FIG. 1, the light-emitting apparatus 200 may include a light-emitting substrate 100. The light-emitting apparatus 200 may emit light through the light-emitting substrate 100 for displaying a fixed image or for prompting; moreover, the light-emitting apparatus 200 may also implement near field communication (NFC) through the light-emitting substrate 100.

For example, the light-emitting apparatus 200 may further include a frame. The light-emitting apparatus 200 may use a frame to fix the light-emitting substrate 100.

For example, the light-emitting apparatus 200 may be any light-emitting apparatus 200 that can display images in stationary (e.g., static images), and whether textual or graphical. More specifically, it is expected that the light-emitting apparatus in the embodiments may be applied in or associated with a plurality of electronic devices, and the plurality of electronic devices may include (but is not limit to), for example, mobile telephones, wireless devices, personal data assistants (PDA), hand-held or portable computers, GPS receivers/navigators, cameras, MP4 video players, video cameras, game consoles, watches, clocks, calculators, TV monitors, flat panel displays, computer monitors, car displays (e.g., odometer displays), navigators, cockpit controllers and/or displays, camera view displays (e.g., rear view camera displays in vehicles), electronic photos, electronic billboards or indicators, projectors, building structures, packagings and aesthetic structures (e.g., a display for an image of a piece of jewelry).

It is worth noting that in some implementations, the electrical signal generated due to the magnetic field formed by the NFC antenna is generally an alternating current signal (a sine wave with positive and negative bands). The light-emitting unit cannot emit light using the alternating current signal but can emit light only using the direct current voltage due to the characteristic of unilateral conductivity of the light-emitting unit. Therefore, the NFC antenna and the light-emitting unit need to be driven separately, and the light-emitting device needs to integrate the NFC antenna and display functions in different substrates. That is, the light-emitting apparatus may include a substrate with an NFC antenna and a display panel, and the substrate with the NFC antenna may be attached to a backlight side of the display panel, so that the light-emitting apparatus may integrate the NFC function and the display function. However, the above arrangement will result in a complicated structure of the light-emitting apparatus, which is not conducive to the thinness and lightness of light-emitting apparatus.

Figure 2:
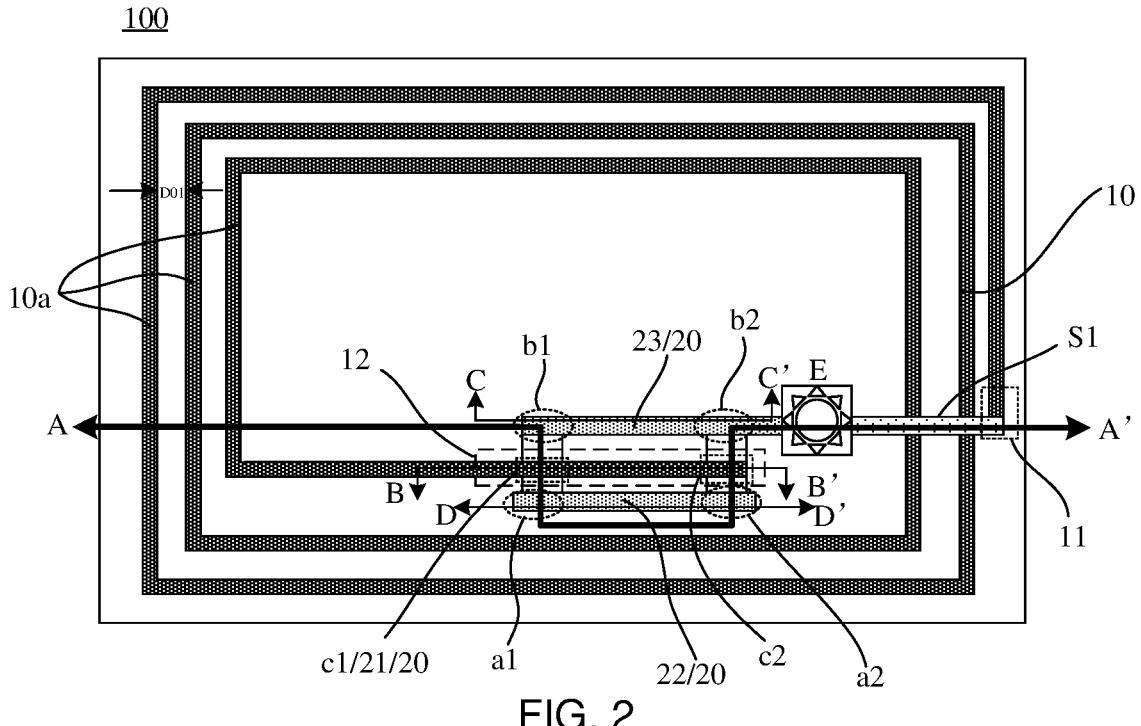
FIG. 2 is a structural diagram of a light-emitting substrate, in accordance with some embodiments.
Figure 3:
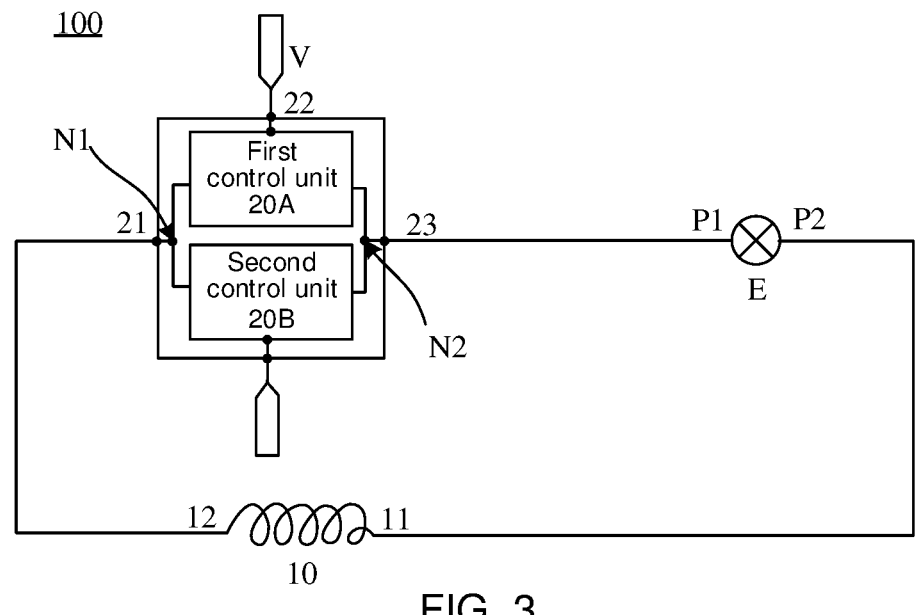
FIG. 3 is a driving circuit diagram of a light-emitting substrate, in accordance with some embodiments.

FIG. 2 is a structural diagram of a light-emitting substrate, in accordance with some embodiments; FIG. 3 is a driving circuit diagram of a light-emitting substrate, in accordance with some embodiments.

Some embodiments of the present disclosure provide a light-emitting substrate 100. Referring to FIGS. 2 and 3, the light-emitting substrate 100 includes a first conductive coil 10, a light-emitting unit E and a control circuit 20.

For example, the light-emitting substrate 100 may be an organic light-emitting diode (OLED) light-emitting substrate, a quantum dot light-emitting diode (QLED) light-emitting substrate, or a tiny light-emitting diode (LED, which includes mini LED or micro LED) light-emitting substrate, or the like.

The first conductive coil 10 is an NFC antenna. The first conductive coil 10 has a first end 11 and a second end 12.

For example, the first end 11 of the first conductive coil 10 is located on outside of the first conductive coil 10, and the second end 11 of the first conductive coil 10 is located on inside of the first conductive coil 10.

For example, the light-emitting substrate 100 may include a base substrate, and the first conductive coil 10 may be located on the base substrate. An orthographic projection of the first conductive coil 10 on the base substrate may be substantially in a shape of any one of a triangle, a rectangle, or a circle. FIG. 2 is illustrated by taking an example in which the orthogonal projection of the first conductive coil 10 on the base substrate is in a shape of a rectangle. However, the shape of the first conductive coil 10 is not limited in the embodiments of the present disclosure.

Based on this, in a case where an external coil is close to the light-emitting substrate 100, the external coil is coupled to the first conductive coil 10, and the external coil and the first conductive coil 10 may generate a magnetic field, so that the external coil and the light-emitting substrate 100 may exchange data, and the light-emitting substrate 100 may achieve the near field communication through the first conductive coil 10. Moreover, in a case where the external coil and the first conductive coil 10 generate a magnetic field, the first conductive coil 10 may generate a first power signal.

With continued reference to FIGS. 2 and 3, the light-emitting unit E includes a first electrode P1 and a second electrode P2. The second electrode P2 of the light-emitting unit E is electrically connected to the first end 11 of the first conductive coil 10, so that the light-emitting unit E is electrically connected to the first conductive coil 10.

For example, one of the first electrode P1 and the second electrode P2 in the light-emitting unit E is the anode of the light-emitting unit E, and the other is the cathode of the light-emitting unit E.

For example, the first electrode P1 of the light-emitting unit E is the anode of the light-emitting unit E, and the second electrode P2 of the light-emitting unit E is the cathode of the light-emitting unit E. Alternatively, the first electrode P1 of the light-emitting unit E is the cathode of the light-emitting unit E, and the second electrode P2 of the light-emitting unit E is the anode of the light-emitting unit E.

With continued reference to FIGS. 2 and 3, the light-emitting substrate 100 is further provided with a control circuit 20 therein. The control circuit 20 may be connected in series between the first conductive coil 10 and the light-emitting unit E, so that the first conductive coil 10, the control circuit 20 and the light-emitting unit E may form a loop.

For example, the control circuit 20 includes a control terminal 21, an input terminal 22 and an output terminal 23. The input terminal 22 of the control circuit 20 is electrically connected to a first power terminal V, and the first power terminal V is configured to transmit a direct current voltage signal. Furthermore, the control terminal 21 of the control circuit 20 is electrically connected to the second end 12 of the first conductive coil 10, and the output terminal 23 of the control circuit 20 is electrically connected to the first electrode P1 of the light-emitting unit E.

The control circuit 20 is configured to transmit a first voltage signal V2 received at the first power terminal V to the light-emitting unit E under control of a first power signal from the first conductive coil 10, so that the light-emitting unit E emits light.

Base on this, in a case where the external coil and the first conductive coil 10 create a magnetic field, the first conductive coil 10 may generate the first power signal. Since the control terminal 21 of the control circuit 20 is electrically connected to the second terminal 12 of the first conductive coil 10, the control terminal 21 of the control circuit 20 may receive the first power signal from the first conductive coil 10. The control circuit 20 may be turned on under the control of the first power signal, and the control circuit 20 may transmit the first voltage signal V2 received from the input terminal 22 of the control circuit 20 to the light-emitting unit E via the output terminal 23 of the control circuit 20. Thus, the light-emitting unit E may receive the first voltage signal V2 at the output terminal 23 of the control circuit 20, and the light-emitting unit E emits light.

In summary, in the light-emitting substrate 100 provided by some of the embodiments of the present disclosure, the first power signal may be generated by the first conductive coil 10 in a case where the first conductive coil 10 and the external coil create a magnetic field. The first power signal generated by the first conductive coil 10 based on the magnetic field is an alternating current signal, and cannot directly act on the light-emitting unit E to cause the light-emitting unit E to emit light. However, the control circuit is directly connected in series between the first conductive coil 10 and the light-emitting unit E, and the first power signal generated by the first conductive coil 10 may be used to drive the control circuit 20 to be turned on; the control circuit 20 may transmit the first voltage signal V2 provided by the first power terminal V to the light-emitting unit E to enable the light-emitting unit E to emit light. Based on this, the light-emitting substrate 100 may integrate the first con-ductive coil 10 and the light-emitting unit E on a same substrate, i.e., may integrate NFC wireless communication and display on one substrate, which is beneficial to the thinness and lightness of the light-emitting substrate 100.

In addition, the light-emitting substrate 100 may also use the first conductive coil 10 to supply power to the light-emitting unit E to drive the light-emitting unit E to perform light-emitting display. Furthermore, the light-emitting sub-strate 100 may not need to be provided with a power source to supply power to the light-emitting unit, and the light-emitting substrate 100 capable of being passively driven by electromagnetic induction, which in turn may be conducive to simplifying the structure of the light-emitting substrate 100.

In some examples, the band of NFC is 13.56 MHz. Based on this, the light-emitting substrate 100 may use the first conductive coil 10 to receive the electromagnetic signal of 13.56 MHz to perform light-emitting display.

In some embodiments, with continued reference to FIG. 2, a thickness of the first conductive coil 10 in the light-emitting substrate 100 is greater than or equal to 1 μm.

The greater the thickness of the first conductive coil 10 in the light-emitting substrate 100, the less the internal resis-tance of the first conductive coil 10, and the greater the inductance generated by the first conductive coil 10, which may make the signal quality of the NFC antenna good. Furthermore, in a case where the thickness of the first conductive coil 10 is equal to or approaches 1 μm, the thickness of the first conductive coil 10 may be made great, which may help to reduce the internal resistance of the first conductive coil 10, i.e., may help to reduce the internal resistance of the antenna; in this case, the inductance of the NFC antenna is great, which helps to improve the signal quality of the NFC antenna.

In some examples, the thickness of the first conductive coil 10 in the light-emitting substrate 100 is approximately any one of 1 μm, 1.5 μm, 2 μm, 2.5 μm, or 3 μm, and the embodiments of the present disclosure are not limited thereto.

It will be noted that, considering an example in which the thickness of the first conductive coil 10 is approximately 1 μm, due to certain uncontrollable errors (e.g., manufacturing process errors, or equipment accuracy), the error of the thickness of the first conductive coil 10 floats in a range of 5%×1 μm; that is, in a case where the thickness of the first conductive coil 10 floats in a range of ±0.05 μm, it may be considered that the thickness of the first conductive coil 10 satisfies the limiting condition of being equal to 1 μm. Other numerical floating ranges for the thickness of the first conductive coil 10 are as above, and will not be repeated here.

In some embodiments, with continued reference to FIG. 2, the number of turns of the first conductive coil 10 in the light-emitting substrate 100 is greater than or equal to 10 turns. However, in order to clearly show the structure of the first conductive coil 10 in FIG. 2, only 3 turns of the first conductive coil 10 are shown in FIG. 2. For the first conductive coil 10 with other turns, the connections of the first end 11 of the first conductive coil 10 and the second end 12 of the first conductive coil 10 are the same as that in the first conductive coil 10 with 3 turns, and the difference is that the number of turns of the first conductive coil 10 is different.

The more turns of the first conductive coil 10 provided in the light-emitting substrate 100, the stronger the magnetic field created by the first conductive coil 10, and the better the signal quality of the NFC antenna. Furthermore, in a case where the number of turns of the first conductive coil 10 is equal to or approaches 10 turns, the number of turns of the first conductive coil 10 is great, which may be beneficial to enhancing the magnetic field created by the first conductive coil 10, i.e., which is beneficial to strengthen the magnetic field created by the NFC antenna and strengthen the signal strength of the NFC antenna, so as to improve the signal quality of the NFC antenna.

In some examples, with continued reference to FIG. 2, the number of turns of the first conductive coil 10 in the light-emitting substrate 100 may be greater than or equal to 30 turns.

In a case where the number of turns of the first conductive coil 10 is equal to or approaches 30 turns, which may strengthen the intensity of the magnetic field created by the first conductive coil 10, and strengthen the signal strength of the NFC antenna well, so as to improve the signal quality of the NFC antenna.

For example, the number of turns of the first conductive coil 10 in the light-emitting substrate 100 is approximately any one of 10 turns, 15 turns, 20 turns, 30 turns, 40 turns, 50 turns, 60 turns, 70 turns or 80 turns, and the embodiments of the present disclosure are not limited thereto.

In some embodiments, with continued reference to FIG. 2, the number of turns of the first conductive coil 10 in the light-emitting substrate 100 is less than or equal to 80 turns.

Since the size of the light-emitting substrate 100 is fixed, i.e., the internal space of the light-emitting substrate 100 is limited, setting the first conductive coil 10 with a great number of turns will result in a less line spacing between two adjacent turns in the first conductive coil 10, which makes the wiring of the coil is more difficult and prone to occur the problem of short-circuit.

Based on this, the number of turns of the first conductive coil 10 in the light-emitting substrate 100 may be set to be less than or equal to 80 turns. In a case where the number of turns of the first conductive coil 10 in the light-emitting substrate 100 is equal to or approaches 80 turns, it is possible to ensure that the number of turns of the first conductive coil 10 is great while ensuring that the line spacing of every two adjacent turns of the first conductive coil is sufficient, that is, it is possible to improve the signal quality of the NFC antenna while preventing the problem of short-circuit at various positions of the NFC antenna.

In some examples, with continued reference to FIG. 2, the number of turns of the first conductive coil 10 in the light-emitting substrate 100 is less than or equal to 50 turns.

In a case where the number of turns of the first conductive coil 10 is equal to or approaches 50 turns, the signal quality of the NFC antenna in the light-emitting substrate 100 is good, and the wiring of the coil of the NFC antenna is less difficult.

For example, the number of turns of the first conductive coil 10 in the light-emitting substrate 100 is approximately any one of 10 turns, 15 turns, 20 turns, 30 turns, 40 turns, 50 turns, 60 turns, 70 turns or 80 turns, and the embodiments of the present disclosure are not limited thereto.

In some examples, with continued reference to FIG. 2, the number of turns of the first conductive coil 10 in the light-emitting substrate 100 may be in a range of 10 turns to 80 turns.

Setting the number of turns of the first conductive coil 10 in the light-emitting substrate 100 within the above range may satisfy the requirement for the number of turns of the first conductive coil 10 in the light-emitting substrate 100, so that the NFC antenna in the light-emitting substrate 100 has a good signal quality; moreover, it may be possible to meet the requirement of difficulty of wiring the first conductive coil 10 in the light-emitting substrate 100, so as to prevent the problem of short-circuit at various positions of the NFC antenna.

In some embodiments, with continued reference to FIG. 2, a line width of the first conductive coil 10 in the light-emitting substrate 100 is greater than or equal to 500 μm.

The greater the line width of the first conductive coil 10 in the light-emitting substrate 100, the less the internal resistance of the first conductive coil 10, the greater the inductance generated by the first conductive coil 10, and the better the signal quality of the NFC antenna. Furthermore, in a case where the line width of the first conductive coil 10 is equal to or approaches 500 μm, the line width of the first conductive coil 10 may be made great, which may help to reduce the internal resistance of the first conductive coil 10, i.e., may help to reduce the internal resistance of the antenna; in this case, the inductance of the NFC antenna is great, which helps to improve the signal quality of the NFC antenna.

In some examples, the line width of the first conductive coil 10 is approximately one of 500 μm, 550 μm, 600 μm, or 650 μm, and the embodiments of the present disclosure are not limited thereto.

It will be noted that, considering an example in which the line width of the first conductive coil 10 is approximately 500 μm, due to certain uncontrollable errors (e.g., manufacturing process errors, or equipment accuracy), the error of the line width of the first conductive coil 10 floats in a range of 5%×500 μm; that is, in a case where the line width of the first conductive coil 10 floats in a range of ±25 μm, it may be considered that the line width of the first conductive coil 10 satisfies the limiting condition of being equal to 500 μm. Other numerical floating ranges for the line width of the first conductive coil 10 are as above, and will not be repeated here.

In some embodiments, with continued reference to FIG. 2, the first conductive coil 10 in the light-emitting substrate 100 includes a plurality of turns of conductive lines 10a, and a first minimum distance D01 between two adjacent turns of conductive lines 10a is greater than or equal to 10 μm.

If the first minimum distance D01 between two adjacent turns of conductive lines 10a in the first conductive coil 10 is too small, the conductive lines 10a in the first conductive coil 10 may be arranged too densely, which may easily lead to problems such as short-circuit in adjacent conductive lines 10a. In addition, the conductive lines 10a are arranged too densely, which will also be difficult to wire the first conductive coil 10 and be difficult to manufacture.

Based on this, the first minimum distance D01 between two adjacent turns of conductive lines 10a in the first conductive coil 10 may be set to be greater than or equal to 10 μm. In a case where the first minimum distance D01 between two adjacent turns of conductive lines 10a of the first conductive coil 10 is equal to or approaches 10 μm, it is possible for the first minimum distance D01 between two adjacent turns of conductive lines 10a of the first conductive coil 10 not to be too small, which may prevent the problem of short-circuit; it is also possible for the first minimum distance D01 between two adjacent turns of conductive lines 10a of the first conductive coil 10 not to be too great, which may avoid the problem of reducing the number of turns of the first conductive coil 10 caused by a fact that the first minimum distance D01 between two adjacent turns of wires 10a of the first conductive coil 10 occupies an too large space.

In some examples, the first minimum distance D01 between two adjacent turns of conductive lines 10a in the first conductive coil 10 is approximately one of 10 μm, 12 μm, 15 μm, 18 μm, or 20 μm, and the present disclosure is not limited thereto.

It will be noted that, considering an example in which the first minimum distance D01 between two adjacent turns of conductive lines 10a in the first conductive coil 10 is approximately 10 μm, due to certain uncontrollable errors (e.g., manufacturing process errors, or equipment accuracy), the error of the first minimum distance D01 between two adjacent turns of conductive lines 10a in the first conductive coil 10 floats in a range of 5%×10 μm; that is, in a case where the first minimum distance D01 floats in a range of ±0.5 μm, it may be considered that the first minimum distance D01 between two adjacent turns of conductive lines 10a in the first conductive coil 10 satisfies the limiting condition of being equal to 10 μm. Other numerical floating ranges of the first minimum distance D01 between two adjacent turns of conductive lines 10a in the first conductive coil 10 are as above, and will not be repeated here.

In some embodiments, as shown in FIG. 3, the first voltage signal V2 provided by the first power terminal V includes a smooth direct current voltage signal or a pulsating direct current voltage signal.

For example, the first voltage signal V2 provided by the first power terminal V may be a smooth direct current voltage signal. For example, a voltage value of the first voltage signal V2 is a fixed value that is not 0. In this case, the light-emitting unit E may continue to receive the constant first voltage signal V2, which may stabilize the luminance of the light-emitting unit E to improve the display effect of the light-emitting substrate 100.

For example, the first voltage signal V2 provided by the first power terminal V may be a pulsating direct current voltage signal. For example, a voltage value of the first voltage signal V2 may be a changing positive value, or the voltage value of the first voltage signal V2 may be a changing negative value. In this case, the light-emitting unit E may continuously receive a positive voltage or a negative voltage to achieve light emission.

In some embodiments, as shown in FIG. 3, the light-emitting unit E includes at least one light-emitting diode.

In some examples, the light-emitting unit E may include one light-emitting diode. The light-emitting substrate 100 may use the single light-emitting diode in the light-emitting unit E to emit light and act as a prompt. In this case, the anode of the light-emitting diode serves as the anode of the light-emitting unit E, and the cathode of the light-emitting diode serves as the cathode of the light-emitting unit E.

In some other examples, the light-emitting unit E may include a plurality of light-emitting diodes. The light-emitting substrate 100 may utilize plurality of diodes in the light-emitting unit E to emit light to display a fixed image. For example, the plurality of light-emitting diodes may be arranged according to the requirement of an image, and a fixed picture may be displayed when the plurality of light-emitting diodes emit light.

The plurality of light-emitting diodes may be connected in parallel or in series.

In a case where the plurality of light-emitting diodes are connected in series, the cathode and the anode of two adjacent light-emitting diodes are electrically connected, and the anode of the first light-emitting diode may be used as the anode of the light-emitting unit E, and the cathode of the last light-emitting diode may be used as the cathode of the light-emitting unit E.

In a case where the plurality of light-emitting diodes are connected in parallel, the anodes of the plurality of light-emitting diodes are electrically connected to one another, and the anode of any light-emitting diode may be used as the anode of the light-emitting unit E; the cathodes of the plurality of light-emitting diodes are electrically connected to one another, and the anode of any light-emitting diode may be used as the cathode of the light-emitting unit E.

In some examples, the light-emitting diodes may include organic light-emitting diodes or inorganic light-emitting diodes.

For example, the light-emitting unit E may be, for example, an OLED, a QLED, a LED or a liquid crystal light-emitting unit, but is not limited thereto.

The type of the light-emitting unit E may not be limited in the embodiments of the present disclosure, that is, the light-emitting unit E may be any other light-emitting unit (e.g., a light-emitting device that emits light by discharging), as long as it is capable of emitting light to enable the light-emitting apparatus to emit light.

In some examples, the introduction will be made in an example in which the light-emitting unit E is an organic light-emitting diode OLED.

The light-emitting unit E further includes a light-emitting portion located between the first electrode P1 and the second electrode P2. The light-emitting portion includes a light-emitting layer (EML).

In a case where the light-emitting unit E receives the first voltage signal V2 from the control circuit 20, i.e., the light-emitting unit E is powered on, electrons and holes migrate to the light-emitting layer through the first electrode P1 and the second electrode P2 respectively and meet in the light-emitting layer to form excitons and excite the luminescent molecules, so that the luminescent molecules emit visible light through radiative relaxation.

In some examples, in addition to the light-emitting layer, the light-emitting portion further includes one or more of an electron transporting layer (ETL), an electron injection layer (EIL), a hole transporting layer (HTL) and a hole injection layer (HIL).

In a case where the light-emitting unit E receives the first voltage signal V2 from the control circuit 20, i.e., the light-emitting unit E is powered on, holes enter the light-emitting unit E from the anode (one of the first electrode P1 and the second electrode P2), and pass through the hole injection layer and the hole transporting layer; electrons enter the light-emitting unit E from the cathode (the other of the first electrode P1 and the second electrode P2), and pass through the electron injection layer and the electron transporting layer, and then, the two reach the light-emitting layer, and the holes and electrons meet in the light-emitting layer to form excitons and excite the luminescent molecules, so that the luminescent molecules emit visible light through radiative relaxation.

In some embodiments, as shown in FIG. 3, the control circuit 20 in the light-emitting substrate 100 includes a first control unit 20A and a second control unit 20B.

A control terminal of the first control unit 20A and a control terminal of the second control unit 20B are electrically connected to a first node N1, and the first node N1 may serve as the control terminal of the control circuit 20. An output terminal of the first control unit 20A and an output terminal of the second control unit 20B are electrically connected to a second node N1, and the second node N2 may serve as an output terminal of the control circuit 20. The output terminal of the first control unit 20A and the output terminal of the second control unit 20B are both electrically connected to the first power terminal V.

With the above structure, in a case where the control terminal 21 of the control circuit 20 receives the first power signal from the first conductive coil 10, the first node N1 may transmit the first power signal to the control terminal of the first control unit 20A and control terminal of the second control unit 20B. In this case, the control terminal of the first control unit 20A and the control terminal of the second control unit 20B may be alternately turned on in response to the first power signal from the first conductive coil 10, so that the control circuit 20 may transmit the first voltage signal V2 from the first power terminal V to the light-emitting unit E to enable the light-emitting unit E to emit light.

Figure 4:
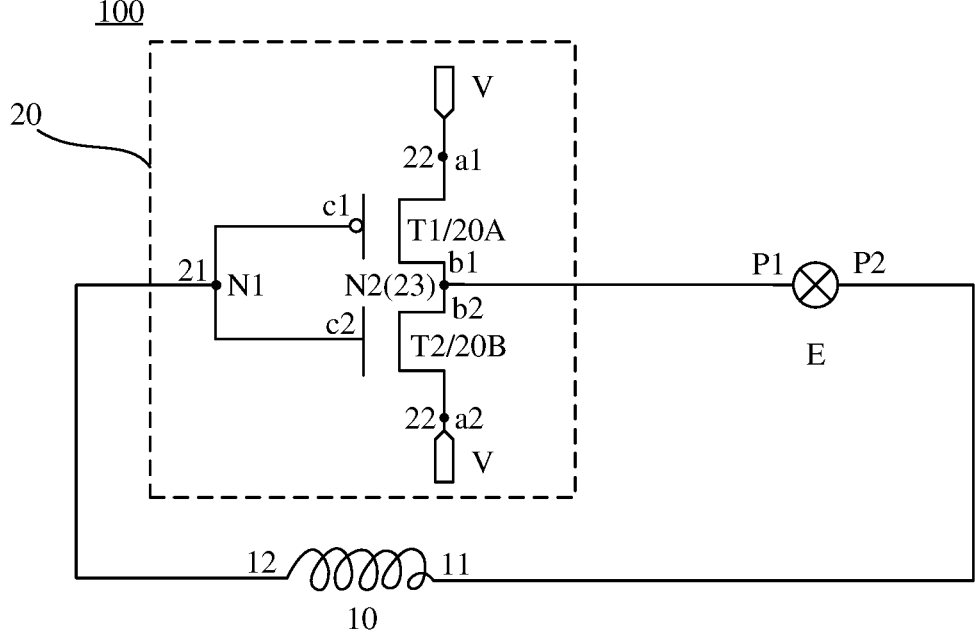
FIG. 4 is a driving circuit diagram of another light-emitting substrate, in accordance with some embodiments.

FIG. 4 is a driving circuit diagram of a light-emitting substrate, in accordance with some other embodiments.

In some embodiments, as shown in FIG. 4, the first control unit 20A includes a P-type transistor T1, and the second control unit 20B includes an N-type transistor T2.

A control electrode c1 of the P-type transistor T1 is electrically connected to the first node N1, a first electrode a1 of the P-type transistor T1 is electrically connected to the first power terminal V, and a second electrode b1 of the P-type transistor T1 is electrically connected to the second node N2. A control electrode c2 of the N-type transistor T2 is electrically connected to the first node N1, a first electrode a2 of the N-type transistor T2 is electrically connected to the first power terminal V, and a second electrode b2 of the N-type transistor T2 is electrically connected to the second node N2. The first node N1 serves as the control terminal 21 of the control circuit 20, and the second node N2 serves as the output terminal 23 of the control circuit 20.

Based on this, in a case where the control terminal 21 of the control circuit 20 receives the first power signal from the first conductive coil 10, the first node N1 may transmit the first power signal to the control electrodes c1 of the P-type transistor T1 and the control electrode c2 of the N-type transistor T2.

Since the first power signal is an alternating current signal, the first power signal is an alternating first level signal and a second level signal. A voltage value of the first level signal in the first power signal is greater than a voltage value of the second level signal in the first power signal.

At a first moment, in a case where the first power signal is the first level signal, i.e., the first power signal is a high level signal, after the control electrode c1 of the P-type transistor T1 receives the first power signal, the P-type transistor T1 is turned off; while after the control electrode c2 of the N-type transistor T2 receives the first power signal, the N-type transistor T2 is turned on. In this case, the N-type transistor T2 may transmit the first voltage signal V2 from the first power terminal V to the second node N2. The second node N2 serves as the output terminal 23 of the control circuit 20 and is electrically connected to the first electrode P1 of the light-emitting unit E. Based on this, the first electrode P1 of the light-emitting unit E may receive the first voltage signal V2 from the output terminal 23 of the control circuit 20, and the potential of the first electrode P1 is increased, so that the two electrodes (the first electrode P1 and the second electrode P2) of the light-emitting unit E has a voltage difference therebetween to drive the light-emitting unit E to emit light.

At a second moment, in a case where the first power signal is a second level signal, i.e., the first power signal is a low level signal, after the control electrode c2 of the N-type transistor T2 receives the first power signal, the N-type transistor T2 is turned off. After the control electrode c1 of the P-type transistor T1 receives the first power signal, the P-type transistor T1 is turned on. In this case, the P-type transistor T1 may transmit the first voltage signal V2 from the first power terminal V to the second node N2. The second node N2 serves as the output terminal 23 of the control circuit 20 and is electrically connected to the first electrode P1 of the light-emitting unit E. Based on this, the first electrode P1 of the light-emitting unit E may receive the first voltage signal V2 from the output terminal 23 of the control circuit 20, and the potential of the first electrode P1 is increased, so that the two electrodes (the first electrode P1 and the second electrode P2) of the light-emitting unit E has a voltage difference therebetween to drive the light-emitting unit E to emit light.

Based on this, under the control of the first level signal and the second level signal that are alternated in the first power signal, the N-type transistor T2 and the P-type transistor T1 are alternately turned on, so that the control circuit 20 may continuously transmit the first voltage signal V2 from the output terminal 23 of the control circuit 20 to the light-emitting unit E. As a result, the first voltage signal V2 is used to drive the light-emitting unit E to emit light.

Figure 5:
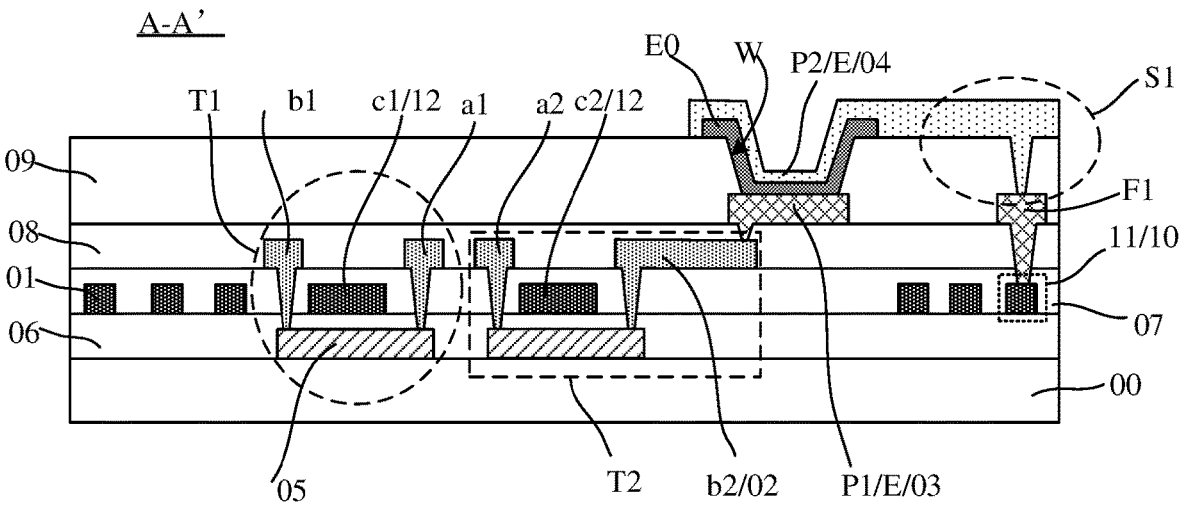
FIG. 5 is a sectional view taken along the A-A' line in FIG. 2.

FIG. 5 is a sectional view taken along the A-A' line in FIG. 2.

In some embodiments, referring to FIG. 5, the light-emitting substrate 100 further includes a base substrate 00, a first gate metal layer 01, a first source-drain metal layer 02, a first electrode metal layer 03 and a second electrode metal layer 04.

In some examples, the base substrate 00 may be a flexible substrate. For example, the base substrate 00 may be made of an organic material. For example, the material of the base substrate 00 may be any one of polyimide (PI), polycarbonate (PC) or polyvinyl chloride (PVC).

In some other examples, the base substrate 00 may be a rigid substrate. For example, the base substrate 00 may be a glass substrate or a polymethyl methacrylate (PMMA) substrate.

The first gate metal layer 01 is located on a side of the base substrate 00. The first gate metal layer 01 includes the control electrode c1 of the P-type transistor T1 and the control electrode c2 of the N-type transistor T2.

In some examples, the light-emitting substrate 100 further includes an active layer 05 between the base substrate 00 and the first gate metal layer 01. The active layer 05 includes a channel of the P-type transistor T1, and the active layer 05 further includes a channel of the N-type transistor T2.

For example, considering an example in which both the P-type transistor T1 and the N-type transistor T2 are low temperature polysilicon (LTPS) transistors, the active layer 05 is made of low temperature polysilicon (LTPS).

In some examples, the light-emitting substrate 100 further includes a first gate insulating layer (GI) 06 located between the active layer 05 and the first gate metal layer 01. The first gate insulating layer 06 insulates the active layer 05 from the first gate metal layer 01.

For example, a material of the first gate insulating layer 06 includes any one of inorganic insulating materials of silicon nitride, silicon oxynitride and silicon oxide. Alternatively, the material of the first gate insulating layer 06 includes silicon dioxide, and the present disclosure is not limited thereto.

The first source-drain metal layer 02 is disposed on a side of the first gate metal layer 01 away from the base substrate 00. The first source-drain metal layer 02 includes the first electrode a1 of the P-type transistor T1, the second electrode b1 of the P-type transistor T1, the first electrode a2 of the N-type transistor T2, and the second electrode b2 of the N-type transistor T2.

In some examples, the light-emitting substrate 100 further includes a first interlayer dielectric layer (ILD) 07 located between the first gate metal layer 01 and the first source-drain metal layer 02. The first interlayer dielectric layer 07 insulates the first gate metal layer 01 from the first source-drain metal layer 02.

For example, the material of the first interlayer dielectric layer 07 may be silicon oxide (SiOx).

The first electrode metal layer 03 is disposed on a side of the first source-drain metal layer 02 away from the base substrate 00. The first electrode metal layer 03 includes the anode (the first electrode P1 or the second electrode P2) of the light-emitting unit E.

In some examples, the light-emitting substrate 100 further includes a planarization layer (PLN) 08 located between the first source-drain metal layer 02 and the first electrode metal layer 03. The planarization layer 08 may not only insulate the first source-drain metal layer 02 from the first electrode metal layer 03, but also play a planarization role to improve the flatness of the light-emitting substrate 100, which is beneficial to subsequent manufacturing for other film layers on the planarization layer 08.

For example, the material of the planarization layer 08 may include an organic material. For example, the material of the planarization layer 08 may include polyimide, acrylic-based polymer, or silicon-based polymer.

The second electrode metal layer 04 is disposed on a side of the first electrode metal layer 03 away from the base substrate 00. The second electrode metal layer 04 includes the cathode (the second electrode P2 or the first electrode P1) of the light-emitting unit E.

One of the first electrode P1 of the light-emitting unit E and the second electrode P2 of the light-emitting unit E is located in the first electrode metal layer 03, and the other is located in the second electrode metal layer 04.

For example, the first electrode metal layer 03 includes the first electrode P1 of the light-emitting unit E, and the second electrode metal layer 04 includes the second electrode P2 of the light-emitting unit E. Alternatively, the first electrode metal layer 03 includes the second electrode P2 of the light-emitting unit E, the second electrode metal layer 04 includes the first electrode P1 of the light-emitting unit E.

In some embodiments, with continued reference to FIG. 5, the light-emitting substrate 100 further includes a light-emitting definition layer 09. The light-emitting definition layer 09 is located between the first electrode metal layer 03 and the second electrode metal layer 04. The light-emitting definition layer 09 includes a plurality of openings W. The light-emitting portion EO of the light-emitting unit E is located in the opening W, and the light-emitting portion EO is sandwiched between the first electrode P1 and the second electrode P2.

In some embodiments, with continued reference to FIG. 5, the first conductive coil 10 is located in the first gate metal layer 01. By forming the first conductive coil 10 in the first gate metal layer 01, there is no need to separately provide another metal layer in the light-emitting substrate 100, that is, there is no need to increase the manufacturing process of the light-emitting substrate 100.

In some examples, the first conductive coil 10 may be formed using the same patterning process as the control electrode c1 of the P-type transistor T1 and the control electrode c2 of the N-type transistor T2 located in the first gate metal layer 01. Therefore, the manufacturing process of the light-emitting substrate 100 may be simplified.

In some examples, the material of the first gate metal layer 01 may be copper. Based on this, the material forming the first conductive coil 10 may be copper. The resistance of copper is small, based on this, the line width of the first conductive coil 10 may be set to be small, and more turns of the first conductive coil 10 may be set in a certain space, which is beneficial to increasing the magnetic field strength of the first conductive coil 10, and thereby improving the quality of near field communication of the light-emitting substrate 100.

In some other embodiments, the first conductive coil 10 may be disposed in the first source-drain metal layer 02. By forming the first conductive coil 10 in the first source-drain metal layer 02, there is no need to separately provide another metal layer in the light-emitting substrate 100, that is, there is no need to increase the manufacturing process of the light-emitting substrate 100.

In some examples, the first conductive coil 10 may be formed using the same patterning process as the first electrode a1 of the P-type transistor T1, the second electrode b1 of the P-type transistor T1, and the first electrode a2 of the N-type transistor T2 and the second electrode b2 of the N-type transistor T2 that are located in the first source-drain metal layer 02. Therefore, the manufacturing process of the light-emitting substrate 100 may be simplified.

In some examples, the material of the first source-drain metal layer 02 may be copper. Based on this, the material forming the first conductive coil 10 may be copper. The resistance of copper is small, based on this, the line width of the first conductive coil 10 may be set to be small, and more turns of the first conductive coil 10 may be set in a certain space, which is beneficial to increasing the magnetic field strength of the first conductive coil 10, and thereby improving the quality of near field communication of the light-emitting substrate 100.

In addition, it will be understood that, in some embodiments, the first conductive coil 10 may also be disposed in another metal film layer in the light-emitting substrate 100, or a metal layer separately provided in the light-emitting substrate 100, which is not limited in the present disclosure.

Figure 6:
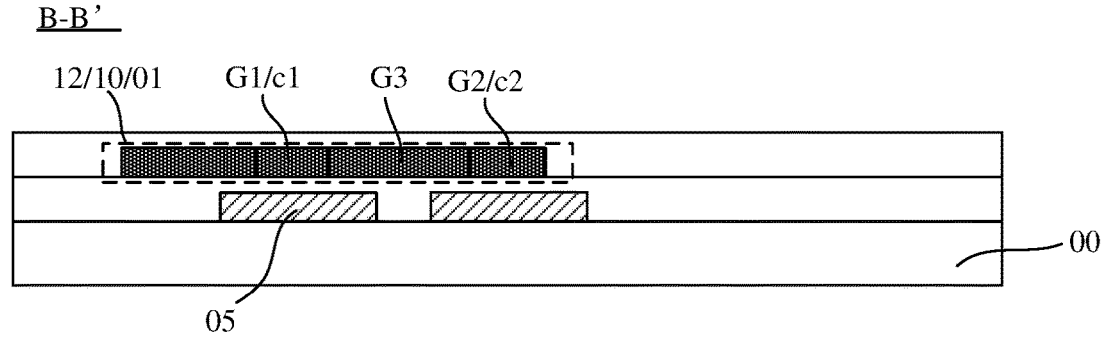
FIG. 6 is a sectional view taken along the B-B' line in FIG. 2.

FIG. 6 is a sectional view taken along the B-B' line in FIG. 2.

In some embodiments, as shown in FIG. 6, the second end 12 of the first conductive coil 10 includes a first sub-portion G1 and a second sub-portion G2. The first sub-portion G1 is also used as the control electrode c1 of the P-type transistor T1, and the second sub-portion G2 is also used as the control electrode c2 of the N-type transistor T2.

In the case where the second end 12 of the first conductive coil 10 needs to be electrically connected to both the control electrode c1 of the P-type transistor T1 and the control electrode c2 of the N-type transistor, the first conductive coil 10 may be disposed in the first gate metal layer 01, and the first sub-portion G1 of the second end 12 of the first conductive coil is also used as the control electrode c1 of the P-type transistor T1, and the second sub-section G2 is also used as the control electrode c2 of the N-type transistor T2. Thus, there is no need for separately patterning the first gate metal layer 01 to form the control electrode c1 of the P-type transistor T1 and the control electrode c2 of the N-type transistor T2, which may help to simplify the manufacturing process of the light-emitting substrate 100.

In some examples, with continued reference to FIG. 6, the second end 12 of the first conductive coil 10 may further include a third sub-portion G3 for connecting the first sub-portion G1 and the second sub-portion G2. The third sub-portion G3 is used to achieve the electrical connection between the first sub-portion G1 and the second sub-portion G2.

For example, the first sub-portion G1, the second sub-portion G2 and the third sub-portion G3 may be formed using the same patterning process. Therefore, the manufacturing process of the light-emitting substrate 100 may be simplified.

Based on this, the first power signal generated by the first conductive coil 10 may be transmitted to the first sub-portion G1 through the second end 12, i.e., to the control electrode c1 of the P-type transistor T1; the third sub-portion G3 is used to transmit the first power signal at the first sub-portion G1 to the second sub-portion G2, i.e., to the control electrode c2 of the N-type transistor T2. Furthermore, the first power signal from the first conductive coil 10 may be used to control the on and off of the P-type transistor T1 and the N-type transistor T2.

It will be understood that, in some other examples, the first sub-portion G1 and the second sub-portion G2 may be arranged to be relatively outwardly expanded. For example, an end of the first sub-portion G1 proximate to the second sub-portion G2 is expanded toward a side proximate to the second sub-portion G2, and an end of the second sub-portion G2 proximate to the first sub-portion G1 is expanded toward a side proximate to the first sub-portion G1, so that the first sub-portion G1 and the second sub-portion G2 may be in contact with and electrically connected to each other. The present disclosure is not limited thereto.

Figure 7:
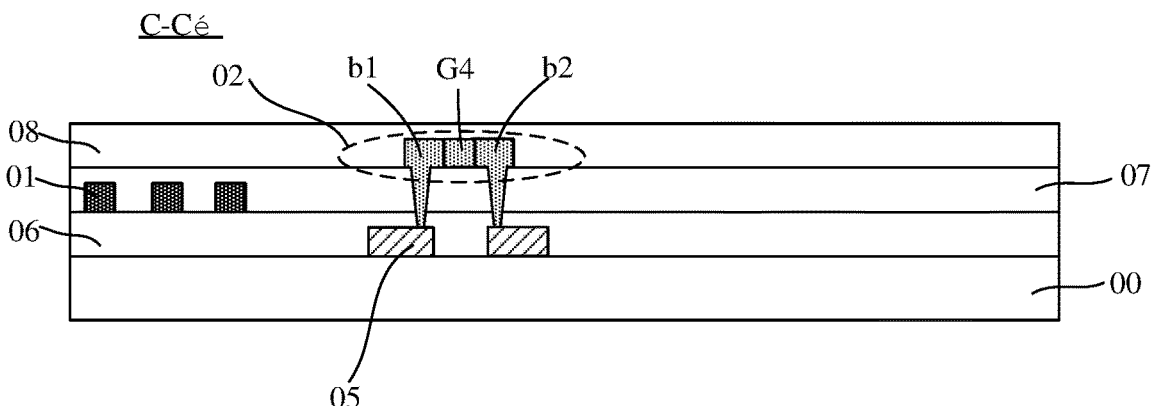
FIG. 7 is a sectional view taken along the line C-C' in FIG. 2.

FIG. 7 is a sectional view taken along the C-C' line in FIG. 2.

In some embodiments, referring to FIG. 7, the second electrode b1 of the P-type transistor T1 is electrically connected to the second electrode b2 of the N-type transistor, so that the P-type transistor T1 and the N-type transistor T2 are connected to the light-emitting unit E.

In some examples, with continued reference to FIG. 7, the first source-drain metal layer 02 may further include a fourth sub-portion G4. The fourth sub-portion G4 is located between the second electrode b1 of the P-type transistor T1 and the second electrode b2 of the N-type transistor T1, and is used to electrically connect the second electrode b1 of the P-type transistor T1 and the second electrode b2 of the N-type transistor T2.

For example, the fourth sub-portion G4, the second electrode b1 of the P-type transistor T1, and the second electrode b2 of the N-type transistor may be formed using the same patterning process. Therefore, the manufacturing process of the light-emitting substrate 100 may be simplified.

Based on this, the fourth sub-portion G4 may be used to be electrically connected to the light-emitting unit E, so that the first voltage signal V2 transmitted by the control circuit 20 through the P-type transistor T1 and the N-type transistor T2 may be transmitted to the light-emitting unit E via the third sub-portion G3 to enable the light-emitting unit E to emit light.

It will be understood that, in some other examples, the second electrode b1 of the P-type transistor T1 and the second electrode b2 of the N-type transistor T2 may be arranged to be relatively outwardly expanded. For example, an end of the second electrode b1 of the P-type transistor T1 proximate to the second electrode b2 of the N-type transistor T2 is expanded outward to a side proximate to the second electrode b2 of the N-type transistor T2, and an end of the second electrode b2 of the N-type transistor T2 proximate to the second electrode b1 of the P-type transistor T1 is expanded outward to a side proximate to the second electrode b1 of the P-type transistor T1, so that the second electrode b1 of the P-type transistor T1 and the second electrode b2 of the N-type transistor T2 are in contact with and electrically connected to each other. The present disclosure is not limited thereto.

Figure 8:
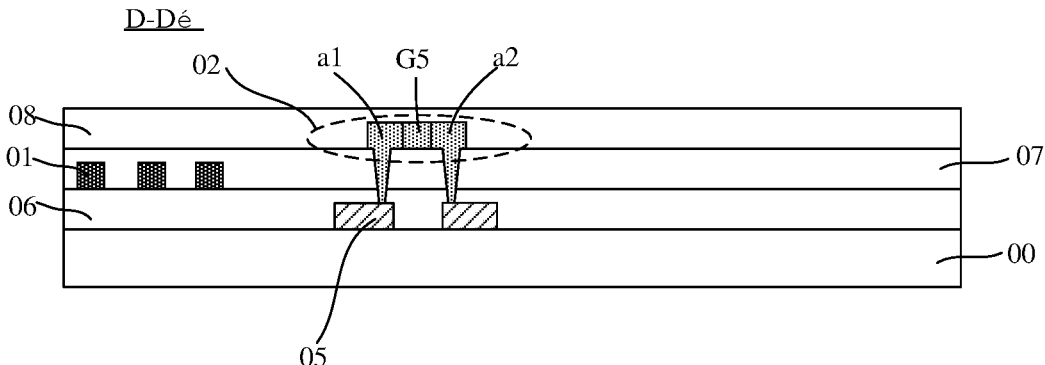
FIG. 8 is a sectional view taken along the line D-D' in FIG. 2.

FIG. 8 is a sectional view taken along the D-D' line in FIG. 2.

In some embodiments, as shown in FIG. 8, the first electrode a1 of the P-type transistor T1 is electrically connected to the first power terminal V, and the first electrode a2 of the N-type transistor T2 is also electrically connected to the first power terminal V. Thus, it is possible to set the first electrode a1 of the P-type transistor T1 to be electrically connected to the first electrode a2 of the N-type transistor T2, which facilitates they are electrically connected to the first power terminal V subsequently.

In some examples, with continued reference to FIG. 8, the first source-drain metal layer 02 may further include a fifth sub-portion G5. The fifth sub-portion G5 is located between the first electrode a1 of the P-type transistor T1 and the first electrode a2 of the N-type transistor T2, and is used to electrically connected to the first electrode a1 of the P-type transistor T1 and the first electrode a2 of the N-type transistor T2.

For example, the fifth sub-portion G5, the first electrode a1 of the P-type transistor T1, and the first electrode a2 of the N-type transistor may be formed using the same patterning process. Therefore, the manufacturing process of the light-emitting substrate 100 may be simplified.

Based on this, the fifth sub-portion G5 may be used to be electrically connected to the light-emitting unit E, so that the first voltage signal V2 transmitted by the control circuit 20 through the P-type transistor T1 and the N-type transistor T2 may be transmitted to the light-emitting unit E via the third sub-portion G3 to enable the light-emitting unit E to emit light.

It will be understood that, in some other examples, the first electrode a1 of the P-type transistor T1 and the first electrode a2 of the N-type transistor T2 may be arranged to be relatively outwardly expanded. For example, an end of the first electrode a1 of the P-type transistor T1 proximate to the first electrode a2 of the N-type transistor T2 is expanded outward to a side proximate to the first electrode a2 of the N-type transistor T2, and an end of the first electrode a2 of the N-type transistor T2 proximate to the first electrode a1 of the P-type transistor T1 is expanded outward to a side proximate to the first electrode a1 of the P-type transistor T1, so that the first electrode a1 of the P-type transistor T1 and the first electrode a2 of the N-type transistor T2 are in contact with and electrically connected to each other. The present disclosure is not limited thereto.

Figure 9:
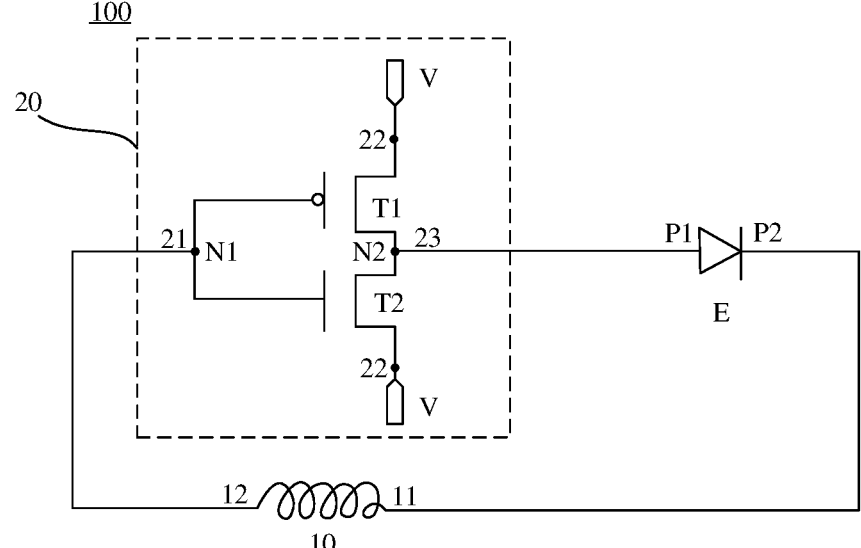
FIG. 9 is a driving circuit diagram of yet another light-emitting substrate, in accordance with some embodiments.
Figure 10:
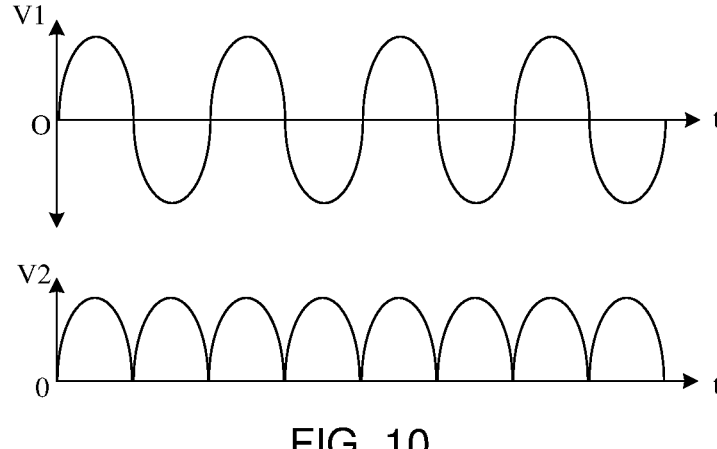
FIG. 10 is a waveform diagram of a first power signal and a first voltage signal in a control circuit, in accordance with some embodiments.

FIG. 9 is a driving circuit diagram of another light-emitting substrate, in accordance with some embodiments. FIG. 10 is a waveform diagram of a first power signal and a first voltage signal in a control circuit, in accordance with some embodiments.

In some embodiments, referring to FIGS. 5 and 9, in the light-emitting substrate 100, a voltage value of the first voltage signal V2 provided by the first power terminal V is greater than 0 V.

In this case, referring to FIG. 10, after the control terminal 21 of the control circuit 20 receives the first power signal from the first conductive coil 10, the P-type transistors T1 and the N-type transistors T2 in the control circuit 20 are driven to be alternately turned on based on the first power signal V1, so as to output the first voltage signal V2 to the light-emitting unit E.

Since the output terminal 23 of the control circuit 20 is electrically connected to the first electrode P1 of the light-emitting unit E, the first electrode P1 of the light-emitting unit E may receive the first voltage signal V2 greater than 0 V from the control circuit 20. In this case, the second electrode P2 of the light-emitting unit E does not receive an external driving voltage, which is equivalent to remaining unpowered (approximately 0 V). Based on this, it is equivalent to a voltage difference between the two electrodes (the first electrode P1 and the second electrode P2) of the light-emitting unit E, so that the light-emitting unit E is driven to emit light. That is, the control circuit 20 may forwardly drive the light-emitting unit E to emit light based on the first voltage signal V2 that is greater than 0 V.

In this case, the first electrode P1 of the light-emitting unit E is equivalent to the anode of the light-emitting unit E, and the first electrode P1 of the light-emitting unit E may be arranged in the first electrode metal layer 03. Furthermore, the second electrode P2 of the light-emitting unit E is equivalent to the cathode of the light-emitting unit E, and the second electrode P2 of the light-emitting unit E may be arranged in the second electrode metal layer 04.

In some embodiments, with reference to FIGS. 9 and 10, the voltage value of the first voltage signal V2 is in a range of 2 V to 5 V, inclusive.

In a case where the voltage value of the first voltage signal V2 is in the range of 2 V to 5 V, inclusive, the light-emitting unit E may be driven to emit light, and it is possible to prevented from burning out the light-emitting unit E caused by a large voltage value of the first voltage signal V2.

In some examples, the voltage value of the first voltage signal V2 may be approximately any one of 2 V, 3 V, 4 V or 5 V, and the present disclosure is not limited thereto.

In some embodiments, referring to FIGS. 9 and 5, a film layer (the planarization layer 08) between the first source-drain metal layer 02 and the first electrode metal layer 03 may be provided with a first via hole therein, and the first via hole may be used to expose the second electrode b2 of the N-type transistor T2 located in the first source-drain metal layer 02, so that the first electrode P1 located in the first electrode metal layer 03 is electrically connected to the second electrode b2 of the N-type transistor T2 located in the first source-drain metal layer 02 through the first via hole.

In some embodiments, a film layer between the first source-drain metal layer 02 and the second electrode metal layer 04 may be provided with a second via hole therein, and the second via hole is used to expose the first end 11 of the first conductive coil 10 located in the first source-drain metal layer 02, so that the second electrode P2 located in the second electrode metal layer 04 may be electrically connected to the first end 11 of the first conductive coil 10 located in the first source-drain metal layer 02 through the second via hole.

In some embodiments, referring to FIGS. 9 and 5, the first electrode metal layer 03 further includes a first connection portion F1. The first end 11 of the first conductive coil 10 is electrically connected to the second electrode P2 of the light-emitting unit E through the first connection portion F1.

Based on this, a film layer (the first interlayer dielectric layer 07 and the planarization layer 08) located between the first source-drain metal layer 02 and the first electrode metal layer 03 may be provided with a third via hole therein, and the third via hole may be used to expose the first end 11 of the first conductive coil 10 located in the first source-drain metal layer 02, so that the first connection portion F1 located in the first electrode metal layer 03 is electrically connected to the first end 11 of the first conductive coil 10 located in the first source-drain metal layer 02 through the third via hole. Moreover, the light-emitting definition layer 09 is provided with a fourth via hole therein, and the fourth via hole is used to expose the first connection portion F1, so that the second electrode P2 located in the second electrode metal layer 04 is electrically connected to the first connection portion F1 located in the first electrode metal layer 03 through the fourth via hole. Thus, the first end 11 of the first conductive coil 10 is electrically connected to the second electrode P2 of the light-emitting unit E through the first connection portion F1.

The design of segmented punching (the third via hole and the fourth via hole being provided) may effectively reduce the depth of the via hole, which is beneficial to reducing the problem of poor via hole contact, and also beneficial to reducing the difficulty of the punching process.

In some examples, as shown in FIG. 9, the first connection portion F1 is located in the same layer as the first electrode P1 of the light-emitting unit E. The first connection portion F1 and the first electrode P1 of the light-emitting unit E may be formed using the same patterning process. Therefore, the manufacturing process of the light-emitting substrate 100 may be simplified.

In some embodiments, as shown in FIGS. 5 and 2, the light-emitting unit E shown in FIG. 2 may be understood as the first electrode P1 (the anode) of the light-emitting unit E, and the second electrode P2 (the cathode) of the light-emitting unit E may be partially expanded to form a first conductive portion S1, and the first conductive portion S1 is used to be electrically connected to the first end 11 of the first conductive coil 10.

Figure 11:
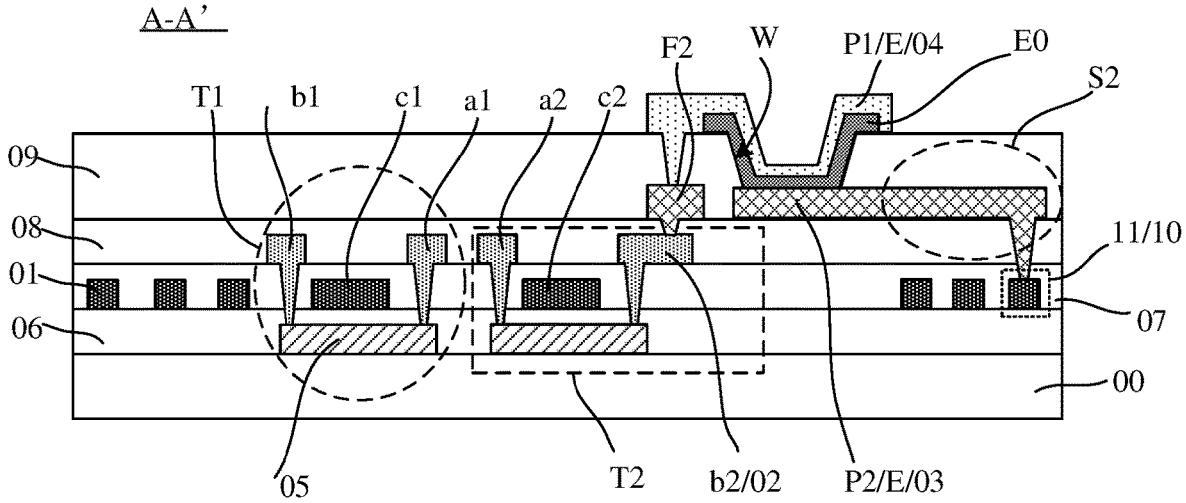
FIG. 11 is another sectional view taken along the A-A' line in FIG. 2.
Figure 12:
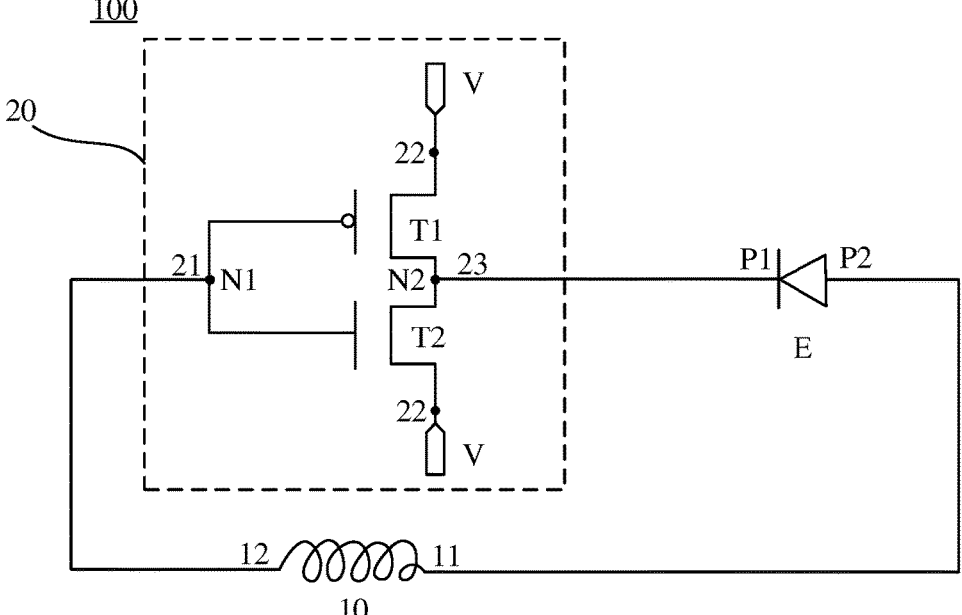
FIG. 12 is a driving circuit diagram of yet another light-emitting substrate, in accordance with some embodiments.
Figure 13:
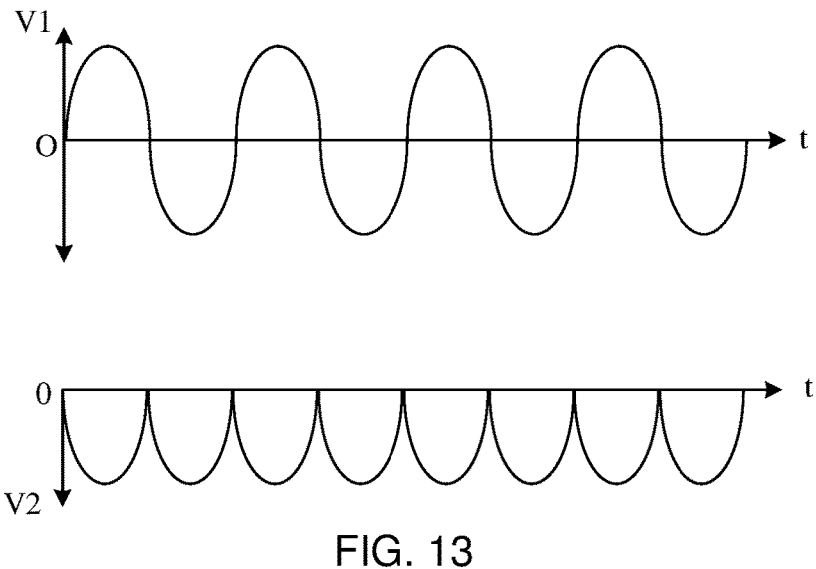
FIG. 13 is a waveform diagram of a first power signal and a first voltage signal in another control circuit, in accordance with some embodiments.

FIG. 11 is another sectional view taken along the A-A' line in FIG. 2. FIG. 12 is another driving circuit diagram of the light-emitting substrate, in accordance with some other embodiments. FIG. 13 is another waveform diagram of the first power signal and the first voltage signal in the control circuit, in accordance with some embodiments.

In some embodiments, referring to FIGS. 11 and 12, in the light-emitting substrate 100, the voltage value of the first voltage signal V2 is less than 0 V. The difference from the light-emitting substrate 100 shown in FIG. 5 is that the voltage value of the first voltage signal V2 is in a different range, resulting in different film layer positions of the first electrode P1 and the second electrode P2 of the light-emitting unit E.

In this case, referring to FIG. 13, in a case where the voltage value of the first voltage signal V2 is less than 0 V, after the control terminal 21 of the control circuit 20 receives the first power signal from the first conductive coil 10, the P-type transistors T1 and the N-type transistors T2 in the control circuit 20 are driven to be alternately turned on based on the first power signal V1, so as to output the first voltage signal V2 that is less than 0 V to the light-emitting unit E.

Since the output terminal 23 of the control circuit 20 is electrically connected to the first electrode P1 of the light-emitting unit E, the first electrode P1 of the light-emitting unit E may receive the first voltage signal V2 that is less than 0 V from the control circuit 20. In this case, the second electrode P2 of the light-emitting unit E does not receive an external driving voltage, which is equivalent to remaining unpowered (approximately 0 V). Based on this, it is equivalent to a voltage difference between the two electrodes (the first electrode P1 and the second electrode P2) of the light-emitting unit E, so that the light-emitting unit E is driven to emit light. That is, the control circuit 20 may reversely drive the light-emitting unit E to emit light based on the first voltage signal V2 that is less than 0 V.

In this case, the first electrode P1 of the light-emitting unit E receive the negative voltage, which is equivalent to the cathode of the light-emitting unit E, so that the first electrode P1 of the light-emitting unit E may be arranged in the second electrode metal layer 04. Moreover, the second electrode P2 of the light-emitting unit E has a higher potential relative to the first electrode P1, and the second electrode P2 may be equivalent to the anode of the light-emitting unit E, so that the second electrode P2 of the light-emitting unit E may be disposed in the first electrode metal layer 03.

In some embodiments, referring to FIGS. 11 to 13, the voltage value of the first voltage signal V2 is in a range of −5 V to −2 V, inclusive.

In a case where the voltage value of the first voltage signal V2 is in the range of −5 V to −2 V, inclusive, the light-emitting unit E may be driven to emit light, and it is possible to prevented from burning out the light-emitting unit E caused by a large voltage value of the first voltage signal V2.

In some examples, the voltage value of the first voltage signal V2 may be approximately any one of −2 V, −3 V, −4 V or −5 V, and the present disclosure is not limited thereto.

In some embodiments, as shown in FIG. 11, the film layers (the first interlayer dielectric layer 07 and the planarization layer 08) located between the first gate metal layer 01 and the first electrode metal layer 03 may be provided with a fifth via hole therein, and the fifth via hole is used to expose the first end 11 of the first conductive coil 10 located in the first gate metal layer 01, so that the second electrode P2 located in the first electrode metal layer 03 is electrically connected to the first end 11 of the first conductive coil 10 located in the first source-drain metal layer 02 through the fifth via hole.

In some examples, as shown in FIGS. 11 and 2, the light-emitting unit E shown in FIG. 2 may be understood as the first electrode P1 (the cathode) of the light-emitting unit E, and the second electrode P2 (the anode) of the light-emitting unit E may be partially expanded to form a second conductive portion S2, and the second conductive portion S2 is used to be electrically connected to the first end 11 of the first conductive coil 10.

In some embodiments, a film layer located between the first source-drain metal layer 02 and the second electrode metal layer 04 may be provided with a sixth via hole therein, and the sixth via hole is used to expose the second electrode b2 of the N-type transistor T2 located in the first source-drain metal layer 02, so that the first electrode P1 located in the second electrode metal layer 04 is electrically connected to the second electrode b2 of the N-type transistor T2 located in the first source-drain metal layer 02 through the sixth via hole.

In some embodiments, referring to FIG. 11, the first electrode metal layer 03 further includes a second connection portion F2. The second electrode b1 of the P-type transistor T1 and the second electrode b2 of the N-type transistor T2 are electrically connected to the first electrode P1 of the light-emitting unit E through the second connection portion F2.

Based on the electrical connection between the second electrode b1 of the P-type transistor T1 and the second electrode b2 of the N-type transistor T2, the second electrode b2 of the N-type transistor T2 may be set to be connected to the first electrode P1 of the light-emitting unit E through the second connection portion F2.

Based on this, a film layer (the planarization layer 08) located between the first source-drain metal layer 02 and the first electrode metal layer 03 may be provided with a seventh via hole therein, and the seventh via hole is used to expose the second electrode b2 of the N-type transistor T2 located in the first source-drain metal layer 02, so that the second connection portion F2 located in the first electrode metal layer 03 is electrically connected to the second electrode b2 of the N-type transistor T2 located in the first source-drain metal layer 02 through the seventh via hole. Moreover, the light-emitting definition layer 09 is provided with an eighth via hole therein, and the eighth via hole is used to expose the second connection portion F2, so that the first electrode P1 located in the second electrode metal layer 04 is electrically connected to the second connection portion F2 located in the first electrode metal layer 03 through the eighth via hole. Thus, the second electrode b2 of the N-type transistor T2 is electrically connected to the first electrode P1 of the light-emitting unit E through the second connection portion F2.

The design of segmented punching (the seventh via hole and the eighth via hole being provided) may effectively reduce the depth of the via hole, which is beneficial to reducing the problem of poor via hole contact, and also beneficial to reducing the difficulty of the punching process.

In some examples, as shown in FIG. 9, the second connection portion F2 may be located in the same layer as the second electrode P2 of the light-emitting unit E. The second connection portion F2 and the second electrode P2 of the light-emitting unit E may be formed using the same patterning process. Therefore, the manufacturing process of the light-emitting substrate 100 may be simplified.

Figure 14:
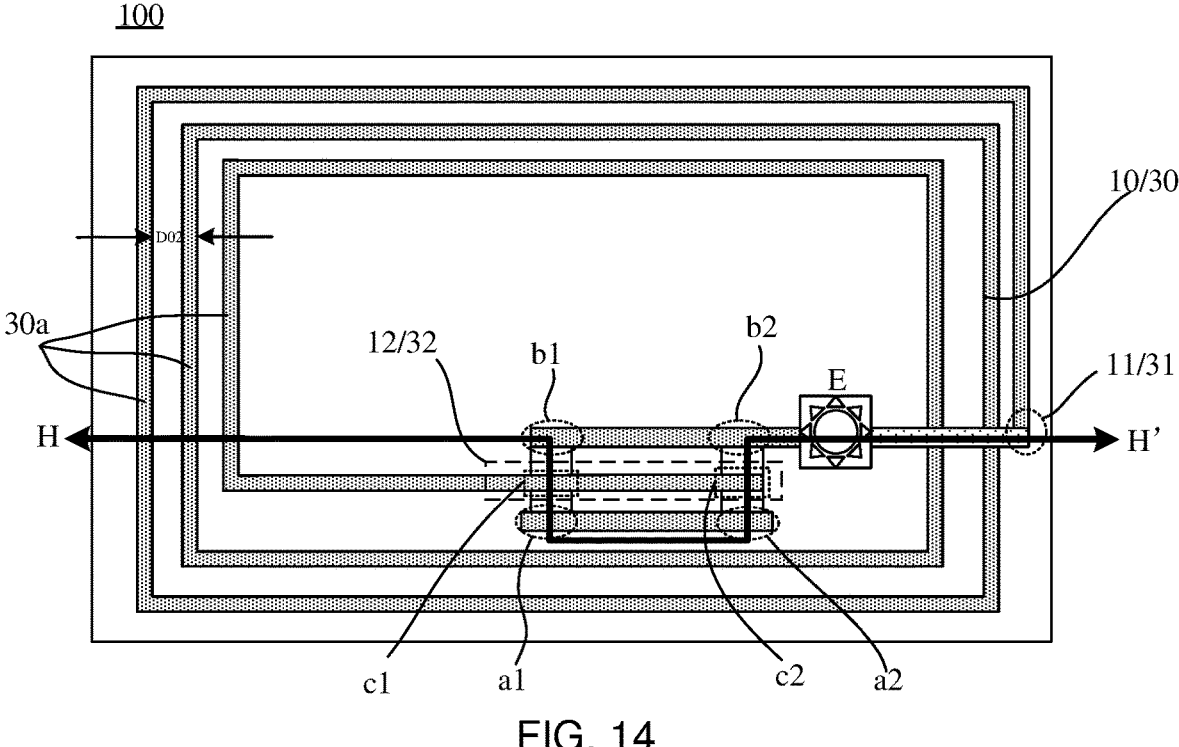
FIG. 14 is a structural diagram of a light-emitting substrate, in accordance with some embodiments.

FIG. 14 is a structural diagram of the light-emitting substrate, in accordance with some other embodiments.

In some embodiments, referring to FIG. 14, the light-emitting substrate 100 further includes a second conductive coil 30. The first conductive coil 10 and the second conductive coil 30 in the light-emitting substrate 100 together constitute an NFC antenna. That is, two conductive coils may be provided in the light-emitting substrate 100 to achieve near-field communication, which is beneficial to improving the signal quality of the NFC antenna.

In some examples, with continued reference to FIG. 14, the first conductive coil 10 and the second conductive coil 30 are located in different film layers in the light-emitting substrate 100, which may be beneficial to increasing the number of turns of the first conductive coil 10 and the number of turns of the second conductive coils 30 compared with a case that the first conductive coil 10 and the second conductive coil 30 are located in a same layer. Thus, it is beneficial to strengthening the magnetic field generated by the NFC antenna, and strengthening the signal strength of the NFC antenna, so as to improve the signal quality of the NFC antenna.

In some examples, with continued reference to FIG. 14, in a case where the first conductive coil 10 and the second conductive coil 30 are located in different film layers in the light-emitting substrate 100, the first conductive coil 10 and the second conductive coil 30 in the light-emitting substrate 100 may be arranged coaxially.

Based on this, in a case where the first conductive coil 10 and the second conductive coil 30 are in operation state, the magnetic field generated by the first conductive coil 10 and the magnetic field generated by the second conductive coil 30 may be superimposed, which may be beneficial to strengthening the magnetic field generated by the NFC antenna, and strengthening the signal strength of the NFC antenna, so as to improve the signal quality of the NFC antenna.

In some examples, with continued reference to FIG. 14, in the light-emitting substrate 100, an orthographic projection of the first conductive coil 10 on the base substrate 00 overlaps at least partially with an orthographic projection of the second conductive coil 30 on the base substrate 00.

In the light-emitting substrate 100, the orthographic projection of the first conductive coil 10 on the base substrate 00 at least partially overlaps with the orthographic projection of the second conductive coil 30 on the base substrate 00, which may facilitate the superposition of the magnetic field generated by the first conductive coil 10 and the magnetic field generated by the second conductive coil 30, so that it is beneficial to strengthening the magnetic field generated by the NFC antenna and strengthening the signal strength of the NFC antenna, so as to improve the signal quality of the NFC antenna.

In some examples, in the light-emitting substrate 100, the orthographic projection of the first conductive coil 10 on the base substrate 00 partially overlaps with the orthographic projection of the second conductive coil 30 on the base substrate 00. Thus, the magnetic field generated by the first conductive coil 10 and the magnetic field generated by the second conductive coil 30 may be superimposed to a certain extent, which may be beneficial to strengthening the magnetic field generated by the NFC antenna and strengthening the signal strength of the NFC antenna, so as to improve the signal quality of the NFC antenna.

For example, in the light-emitting substrate 100, the orthographic projection of the first conductive coil 10 on the base substrate 00 completely overlaps with the orthographic projection of the second conductive coil 30 on the base substrate 00. Thus, the magnetic field generated by the first conductive coil 10 and the magnetic field generated by the second conductive coil 30 may be superimposed well, which may be beneficial to strengthening the magnetic field generated by the NFC antenna and strengthening the signal strength of the NFC antenna, so as to improve the signal quality of the NFC antenna.

However, the overlapping degree of the orthographic projection of the first conductive coil 10 in the light-emitting substrate 100 on the base substrate 00 and the orthographic projection of the second conductive coil 30 on the base substrate 00 is not limited in the embodiments of the present disclosure.

In some embodiments, with continued reference to FIG. 14, a thickness of the second conductive coil 30 in the light-emitting substrate 100 is greater than or equal to 1 μm.

The greater the thickness of the second conductive coil 30 in the light-emitting substrate 100, the less the internal resistance of the second conductive coil 30, and the greater the inductance generated by the second conductive coil 30, which may make the signal quality of the NFC antenna good. Furthermore, in a case where the thickness of the second conductive coil 30 is equal to or approaches 1 μm, the thickness of the second conductive coil 30 may be made great, which may help to reduce the internal resistance of the second conductive coil 30, i.e., may help to reduce the internal resistance of the antenna; in this case, the inductance of the NFC antenna is great, which helps to improve the signal quality of the NFC antenna.

In some examples, the thickness of the second conductive coil 30 in the light-emitting substrate 100 is approximately any one of 1 μm, 1.5 μm, 2 μm, 2.5 μm, or 3 μm, and the embodiments of the present disclosure are not limited thereto.

It will be noted that, considering an example in which the thickness of the second conductive coil 30 is approximately 1 μm, due to certain uncontrollable errors (e.g., manufacturing process errors, or equipment accuracy), the error of the thickness of the second conductive coil 30 floats in a range of 5%×1 μm; that is, in a case where the thickness of the second conductive coil 30 floats in a range of ±0.05 μm, it may be considered that the thickness of the second conductive coil 30 satisfies the limiting condition of being equal to 1 μm. Other numerical floating ranges for the thickness of the second conductive coil 30 are as above, and will not be repeated here.

In some examples, the thickness of the second conductive coil 30 may be approximately equal to the thickness of the first conductive coil 10. It will be understood that, in some other examples, the thickness of the second conductive coil 30 may be different from the thickness of the first conductive coil 10, and the embodiments of the present disclosure are not limited thereto.

In some embodiments, with continued reference to FIG. 14, the number of turns of the second conductive coil 30 in the light-emitting substrate 100 is greater than or equal to 10 turns. However, in order to clearly show the structure of the second conductive coil 30 in FIG. 14, only 3 turns of the second conductive coil 30 are shown in FIG. 14. For the second conductive coil 30 with other turns, the connections of the first end 31 of the second conductive coil 30 and the second end 32 of the second conductive coil 30 are the same as that in the second conductive coil 30 with 3 turns, and the difference is that the number of turns of the second conductive coil 10 is different.

The more turns of the second conductive coil 30 provided in the light-emitting substrate 100, the stronger the magnetic field generated by the second conductive coil 30, and the better the signal quality of the NFC antenna. Furthermore, in a case where the number of turns of the second conductive coil 30 is equal to or approaches 10 turns, the number of turns of the second conductive coil 30 is great, which is beneficial to enhancing the magnetic field generated by the second conductive coil 30, i.e., which is beneficial to strengthen the magnetic field created by the NFC antenna and strengthen the signal strength of the NFC antenna, so as to improve the signal quality of the NFC antenna.

In some examples, with continued reference to FIG. 14, the number of turns of the second conductive coil 30 in the light-emitting substrate 100 may be greater than or equal to 30 turns.

In a case where the number of turns of the second conductive coil 30 is equal to or approaches 30 turns, which may strengthen the intensity of the magnetic field generated by the second conductive coil 30, and strengthen the signal strength of the NFC antenna well, so as to improve the signal quality of the NFC antenna.

For example, the number of turns of the second conductive coil 30 in the light-emitting substrate 100 is approximately any one of 10 turns, 15 turns, 20 turns, 30 turns, 40 turns, 50 turns, 60 turns, 70 turns or 80 turns, and the embodiments of the present disclosure are not limited thereto.

In some embodiments, with continued reference to FIG. 14, the number of turns of the second conductive coil 30 in the light-emitting substrate 100 is less than or equal to 80 turns.

Since the size of the light-emitting substrate 100 is fixed, i.e., the internal space of the light-emitting substrate 100 is limited, setting the second conductive coil 30 with a great number of turns will result in a less line spacing between two adjacent turns in the second conductive coil 30, which makes the wiring of the coil is more difficult and prone to occur the problem of short-circuit.

Based on this, the number of turns of the second conductive coil 30 in the light-emitting substrate 100 may be set to be less than or equal to 80 turns. In a case where the number of turns of the second conductive coil 30 in the light-emitting substrate 100 is equal to or approaches 80 turns, it is possible to ensure that the number of turns of the second conductive coil 30 is great while ensuring that the line spacing of every two adjacent turns of the second conductive coil is sufficient, that is, it is possible to improve the signal quality of the NFC antenna while preventing the problem of short-circuit at each position of the NFC antenna.

In some examples, with continued reference to FIG. 14, the number of turns of the second conductive coil 30 in the light-emitting substrate 100 is less than or equal to 50 turns.

In a case where the number of turns of the second conductive coil 30 is equal to or approaches 50 turns, the signal quality of the NFC antenna in the light-emitting substrate 100 is good, and the wiring of the coil of the NFC antenna is less difficult.

For example, the number of turns of the second conductive coil 30 in the light-emitting substrate 100 is approximately any one of 10 turns, 15 turns, 20 turns, 30 turns, 40 turns, 50 turns, 60 turns, 70 turns or 80 turns, and the embodiments of the present disclosure are not limited thereto.

In some examples, with continued reference to FIG. 14, the number of turns of the second conductive coil 30 in the light-emitting substrate 100 may be in a range of 10 turns to 80 turns.

Setting the number of turns of the second conductive coil 30 in the light-emitting substrate 100 within the above range may satisfy the requirement for the number of turns of the second conductive coil 30 in the light-emitting substrate 100, so that the NFC antenna in the light-emitting substrate 100 has a good signal quality; moreover, it may be possible to meet the requirement of difficulty of wiring the second conductive coil 30 in the light-emitting substrate 100, so as to prevent the problem of short-circuit at various positions of the NFC antenna.

In some examples, the number of turns of the second conductive coil 30 may be set to be approximately equal to the number of turns of the first conductive coil 10. It will be understood that, in some other examples, the number of turns of the second conductive coil 30 may be different from the number of turns of the first conductive coil 10, and the embodiments of the present disclosure are not limited thereto.

In some embodiments, with continued reference to FIG. 14, a line width of the second conductive coil 30 in the light-emitting substrate 100 is greater than or equal to 500 μm.

The greater the line width of the second conductive coil 30 in the light-emitting substrate 100, the less the internal resistance of the second conductive coil 30, the greater the inductance generated by the second conductive coil 30, and the better the signal quality of the NFC antenna. Furthermore, in a case where the line width of the second conductive coil 30 is equal to or approaches 500 μm, the line width of the second conductive coil 30 may be made great, which may help to reduce the internal resistance of the second conductive coil 30, i.e., may help to reduce the internal resistance of the antenna; in this case, the inductance of the NFC antenna is great, which helps to improve the signal quality of the NFC antenna.

In some examples, the line width of the second conductive coil 30 is approximately one of 500 μm, 550 μm, 600 μm, or 650 μm, and the embodiments of the present disclosure are not limited thereto.

It will be noted that, considering an example in which the line width of the second conductive coil 30 is approximately 500 μm, due to certain uncontrollable errors (e.g., manufacturing process errors, or equipment accuracy), the error of the line width of the second conductive coil 30 floats in a range of 5%×500 μm; that is, in a case where the line width of the second conductive coil 30 floats in a range of ±25 μm, it may be considered that the line width of the second conductive coil 30 satisfies the limiting condition of being equal to 500 μm. Other numerical floating ranges for the line width of the second conductive coil 30 are as above, and will not be repeated here.

In some examples, the line width of the second conductive coil 30 may be set to be approximately equal to the line width of the first conductive coil 10. It will be understood that, in some other examples, the line width of the second conductive coil 30 may be set to be different from the line width of the first conductive coil 10, and the embodiments of the present disclosure are not limited thereto.

In some embodiments, with continued reference to FIG. 14, the second conductive coil 30 in the light-emitting substrate 100 includes a plurality of turns of conductive lines 30a, and a second minimum distance D02 between two adjacent turns of conductive lines 30a is greater than or equal to 10 μm.

If the second minimum distance D02 between two adjacent turns of conductive lines 30a of the second conductive coil 30 is too small, the conductive lines 30a in the second conductive coil 30 may be arranged too densely, which may easily lead to problems such as short-circuit in adjacent conductive lines 30a. In addition, the conductive lines 30a are arranged too densely, which will also be difficult to wire the second conductive coil 30 and be difficult to manufacture.

Based on this, the second minimum distance D02 between two adjacent turns of conductive lines 30a of the second conductive coil 30 may be set to be greater than or equal to 10 μm. In a case where the second minimum distance D02 between two adjacent turns of conductive lines 30a of the second conductive coil 30 is equal to or approaches 10 μm, it is possible for the second minimum distance D02 between two adjacent turns of conductive lines 30a of the second conductive coil 30 not to be too small, which may prevent the problem of short-circuit; it is also possible for the second minimum distance D02 between two adjacent turns of conductive lines 30a of the second conductive coil 30 not to be too great, which may avoid the problem of reducing the number of turns of the second conductive coil 30 caused by a fact that the second minimum distance D02 between two adjacent turns of conductive lines 30*a* of the second conductive coil 30 occupies an too large space.

In some examples, the second minimum distance D02 between two adjacent turns of conductive lines 30*a* of the second conductive coil 30 is approximately one of 10 μm, 12 μm, 15 μm, 18 μm, or 20 μm, and the present disclosure is not limited thereto.

It will be noted that, considering an example in which the second minimum distance D02 between two adjacent turns of conductive lines 30*a* of the second conductive coil 30 is approximately 10 μm, due to certain uncontrollable errors (e.g., manufacturing process errors, or equipment accuracy), the error of the second minimum distance D02 between two adjacent turns of conductive lines 30*a* of the second conductive coil 30 floats in a range of 5%×10 μm; that is, in a case where the second minimum distance D02 floats in a range of ±0.5 μm, it may be considered that the second minimum distance D02 between two adjacent turns of conductive lines 30*a* of the second conductive coil 30 satisfies the limiting condition of being equal to 10 μm. Other numerical floating ranges of the second minimum distance D02 between two adjacent turns of conductive lines 30*a* of the second conductive coil 30 are as above, and will not be repeated here.

In some examples, the second minimum distance D02 of the second conductive coil 30 may be set to be approximately equal to the first minimum distance D01 of the first conductive coil 10. It will be understood that, in some other examples, the second minimum distance D02 of the second conductive coil 30 may be set to be different from the first distance D01 of the first conductive coil 10, and the embodiments of the present disclosure are not limited thereto.

In some examples, the first conductive coil 10 and the second conductive coil 30 in the light-emitting substrate 100 may be arranged in series. The two conductive coils in the light-emitting substrate 100 are connected in series, which may help increase the number of turns of the NFC antenna, strengthen the magnetic field generated by the NFC antenna and strengthen the signal strength of the NFC antenna, so as to improve the signal quality of the NFC antenna.

For example, the second conductive coil 30 has a first end 31 and a second end 32. The second end 12 of the first conductive coil 10 is set to be electrically connected to the second end 32 of the second conductive coil 30; the first end 11 of the first conductive coil 10 serves as the first end of the NFC antenna, and the first end 31 of the second conductive coil 30 serves as the second end of the NFC antenna.

In some other examples, with continued reference to FIG. 14, the first conductive coil 10 and the second conductive coil 30 in the light-emitting substrate 100 may be connected in parallel. The two conductive coils in the light-emitting substrate 100 are connected in parallel, which may help reduce the internal resistance of the NFC antenna and improve the signal quality of the NFC antenna.

For example, the second conductive coil 30 has a first end 31 and a second end 32. The first end 11 of the first conductive coil 10 may be set to be electrically connected to the first end 31 of the second conductive coil 30, and the first end 11 of the first conductive coil 10 or the first end 31 of the second conductive coil 30 serves as the first end of the NFC antenna; the second end 12 of the first conductive coil 10 may be set to be electrically connected to the second end 32 of the second conductive coil 30, and the second end 12 of the first conductive coil 10 or the second end 32 of the second conductive coil 30 serves as the second end of the NFC antenna. Thus, it is possible to achieve that the first conductive coil 10 and the second conductive coil 30 in the light-emitting substrate 100 are connected in parallel.

Figure 15:
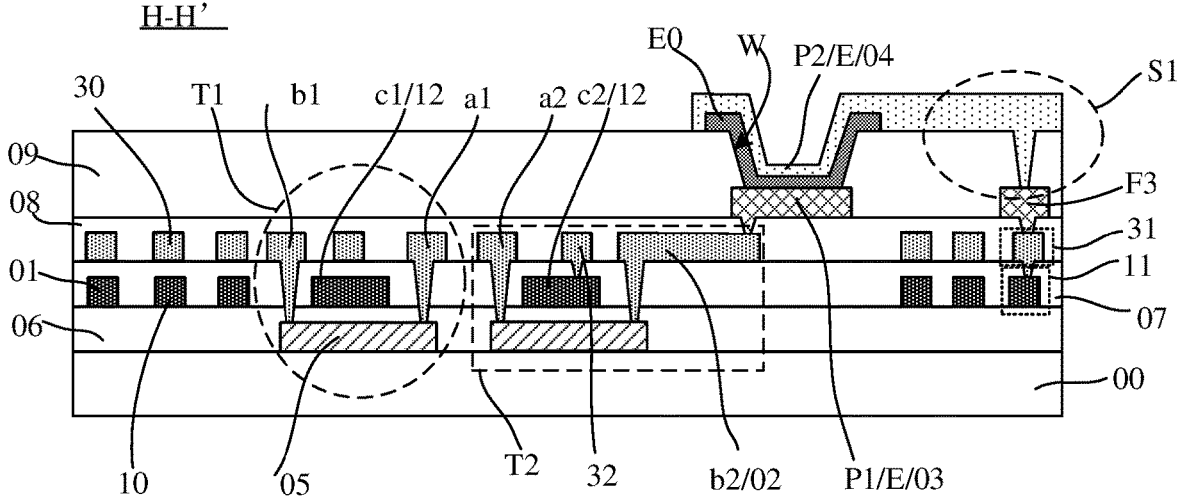
FIG. 15 is a section along the H-H' line in FIG. 14.
Figure 16:
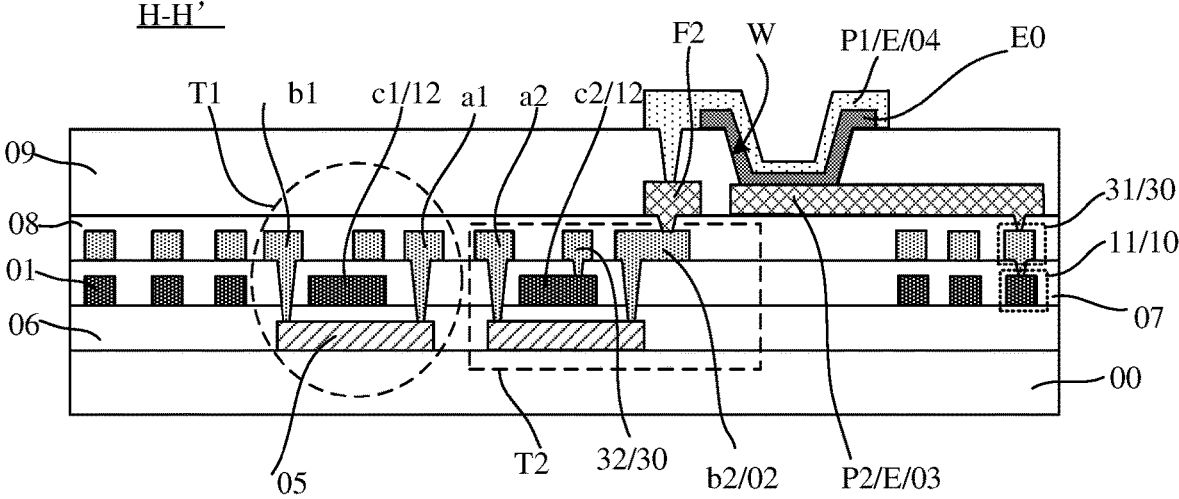
FIG. 16 is another sectional view taken along the line H-H' in FIG. 14.

FIG. 15 is a sectional view taken along the H-H' line in FIG. 14. FIG. 16 is another sectional view taken along the H-H' line in FIG. 14.

In some embodiments, referring to FIGS. 15 and 16, one of the first conductive coil 10 and the second conductive coil 30 in the light-emitting substrate 100 is located in the first gate metal layer 01, and the other is located in the first source-drain metal layer 02.

The following description will be made by taking an example in which the first conductive coil 10 in the light-emitting substrate 100 is located in the first gate metal layer 01, and the second conductive coil 30 is located in the first source-drain metal layer 02.

In some examples, the material of the first source-drain metal layer 02 may be copper. Based on this, the material forming the second conductive coil 30 may be copper. The resistance of copper is small, based on this, the line width of the second conductive coil 30 may be set to be small, and more turns of the second conductive coil 30 may be set in a certain space, which is beneficial to increasing the magnetic field strength of the second conductive coil 30 and thereby improving the quality of near field communication of the light-emitting substrate 100.

In some other examples, the second conductive coil 30 may be located in the first gate metal layer 01.

For example, the material of the first gate metal layer 01 may be copper. Based on this, the material forming the second conductive coil 30 may be copper. The resistance of copper is small, based on this, the line width of the second conductive coil 30 may be set to be small, and more turns of the second conductive coil 30 may be set in a certain space, which is beneficial to increasing the magnetic field strength of the second conductive coil 30 and thereby improving the quality of near field communication of the light-emitting substrate 100.

In addition, it will be understood that, in some other embodiments, the second conductive coil 30 may also be disposed in another metal film layer in the light-emitting substrate 100 or a metal layer separately provided in the light-emitting substrate 100, and the present disclosure is not limited thereto.

The following description will be made by taking an example in which the first conductive coil 10 and the second conductive coil 30 are connected in parallel, the first conductive coil 10 is located in the first gate metal layer 01, and the second conductive coil 30 is located in the first source-drain metal layer 02.

In a first situation, with continued reference to FIG. 15, the first electrode P1 of the light-emitting unit E is equivalent to the anode of the light-emitting unit E, and is located in the first electrode metal layer 03; the second electrode P2 of the light-emitting unit E is equivalent to the cathode of the light-emitting unit E, and is located in the second electrode metal layer 04.

The first conductive coil 10 and the second conductive coil 30 are connected in parallel, it is necessary to set the first end 11 of the first conductive coil 10 to be electrically connected to the first end 31 of the second conductive coil 30, and the second end 12 of the first conductive coil 10 to be electrically connected to the second end 32 of the second conductive coil 30.

For the case that the first end 11 of the first conductive coil 10 is electrically connected to the first end 31 of the second conductive coil 30, the description will be made below.

Referring to FIG. 15, the first interlayer dielectric layer 07 located between the first gate metal layer 01 and the first source-drain metal layer 02 is provided with a first through hole therein. The first through hole may be used to expose the first end 11 of the first conductive coil 10 located in the first gate metal layer 01, so that the first end 31 of the second conductive coil 30 located in the first source-drain metal layer 02 is electrically connected to the first end 11 of the first conductive coil 10 located in the first gate metal layer 01 through the first through hole.

For the case that the second end 12 of the first conductive coil 10 is electrically connected to the second end 32 of the second conductive coil 30, the description will be made below.

As shown in FIG. 6, the second end 12 of the first conductive coil 10 includes a first sub-portion G1 and a second sub-portion G2. The first sub-portion G1 is also used as the control electrode c1 of the P-type transistor T1, and the second sub-portion G2 is also used as the control electrode c2 of the N-type transistor T2.

Based on this, on the basis that the first sub-portion G1 of the second end 12 of the first conductive coil 10 is also used as the control electrode c1 of the P-type transistor T1, and the second sub-portion G2 is also used as the control electrode c2 of the N-type transistor T2, it is possible to set the second end 32 of the second conductive coil 30 to be electrically connected to the control electrode c2 of the N-type transistor T2, that is, it is possible to achieve that the second end 12 of the first conductive coil 10 is electrically connected to the second end 32 of the second conductive coil 30.

With continued reference to FIG. 15, further, the first interlayer dielectric layer 07 between the first gate metal layer 01 and the first source-drain metal layer 02 is provided with a second through hole therein, and the second through hole may be used to expose the control electrode c2 of the N-type transistor T2 located in the first gate metal layer 01, so that the second end 32 of the second conductive coil 30 located in the first source-drain metal layer 02 is electrically connected to the control electrode c2 of the N-type transistor T2 located in the first gate metal layer 01 through the second through hole.

In some examples, the first interlayer dielectric layer 07 between the first gate metal layer 01 and the first source-drain metal layer 02 may also be provided with a third through hole therein, and the third through hole is used to expose the control electrode c1 of the P-type transistor T1 in the first gate metal layer 01, so that the second end 32 of the second conductive coil 30 located in the first source-drain metal layer 02 is electrically connected to the control electrode c1 of the P-type transistor T1 through the third through hole.

For the case that the first end 11 of the first conductive coil 10 is further electrically connected to the second electrode P2 of the light-emitting unit E, the description will be made below.

Referring to FIG. 15, the first end 31 of the second conductive coil 30 is located between the first end 11 of the first conductive coil 10 and the second electrode P2 of the light-emitting unit E. Therefore, the second electrode P2 of the light-emitting unit E may be set to be electrically connected to the first end 11 of the first conductive coil 10 through the first end 31 of the second conductive coil 30, which is convenient to connect both the first conductive coil 10 and the second conductive coil 30 to the light-emitting unit E.

In some examples, the film layers (the planarization layer 08 and the light-emitting definition layer 09) located between the second electrode metal layer 04 and the first source-drain metal layer 02 are provided with a fourth through hole therein. The fourth through hole may be used to expose the first end 31 of the second conductive coil 30 located in the first source-drain metal layer 02, so that the second electrode P2 of the light-emitting unit E located in the second electrode metal layer 04 is electrically connected to the first end 31 of the second conductive coil 30 located in the first source-drain metal layer 02 through the fourth through hole. Thus, both the first conductive coil 10 and the second conductive coil 30 are electrically connected to the light-emitting unit E.

Based on this, a segmented punching design (the first through hole and the fourth through hole being provided) is used to realize that the first end 11 of the first conductive coil 10 is electrically connected to the second electrode P2 of the light-emitting unit E, compared with a case that one connection hole is provided between the first end 11 of the first conductive coil 10 and the second electrode P2 of the light-emitting unit E, it is possible to effectively reduce the depth of the through hole, which is beneficial to reducing the problem of poor contact of the through hole and is beneficial to reducing the difficulty of punching process.

In some other examples, the light-emitting substrate 100 may further include a third connection portion F3 located in the first electrode metal layer 03. The first end 31 of the second conductive coil 30 may be electrically connected to the second electrode P2 of the light-emitting unit E through the third connection portion F3.

For example, the planarization layer 08 located between the first source-drain metal layer 02 and the first electrode metal layer 03 may be provided with a fifth through hole therein. The fifth through hole may be used to expose the first end 31 of the second conductive coil 30 located in the first source-drain metal layer 02, so that the third connection portion F3 located in the first electrode metal layer 03 is electrically connected to the first end 31 of the second conductive coil 30 located in the first source-drain metal layer 02 through the fifth through hole.

Moreover, the light-emitting definition layer 09 located between the first electrode metal layer 03 and the second electrode metal layer 04 may include a sixth through hole. The sixth through hole may be used to expose the third connection portion F3 located in the first electrode metal layer 03, so that the second electrode P2 located in the light-emitting unit E located in the second electrode metal layer 04 may be electrically connected to the third connection portion F3 located in the first electrode metal layer 03 through the sixth through hole. Based on this, it may be realized that the first end 31 of the second conductive coil 30 is electrically connected to the second electrode P2 of the light-emitting unit E through the third connection portion F3.

With a segmented punching design (the first through hole, the fifth through hole, and the fourth through hole being provided) is used to realize that the first end 11 of the first conductive coil 10 is electrically connected to the second electrode P2 of the light-emitting unit E, compared with a case that one connection hole is provided between the first end 11 of the first conductive coil 10 and the second electrode P2 of the light-emitting unit E, it is possible to effectively reduce the depth of the through hole, which is beneficial to reducing the problem of poor contact of the through hole and is beneficial to reducing the difficulty of punching process.

It will be noted that, except for the above description, other structures of the light-emitting substrate 100 shown in FIG. 15 are similar to that of the light-emitting substrate 100 shown in FIG. 5, and reference may be made to the description of the position of the light-emitting substrate 100 shown in FIG. 5.

In a second situation, with continued reference to FIG. 16, the first electrode P1 of the light-emitting unit E is equivalent to the cathode of the light-emitting unit E, and is located in the second electrode metal layer 04; the second electrode P2 of the light-emitting unit E is equivalent to the anode of the light-emitting unit E, and is located in the first electrode metal layer 03.

The first conductive coil 10 and the second conductive coil 30 are connected in parallel, it is necessary to set the first end 11 of the first conductive coil 10 to be electrically connected to the first end 31 of the second conductive coil 30, and the second end 12 of the first conductive coil 10 to be electrically connected to the second end 32 of the second conductive coil 30.

For the case that the first end 11 of the first conductive coil 10 is electrically connected to the first end 31 of the second conductive coil 30, the description will be made below.

Referring to FIG. 16, the first interlayer dielectric layer 07 located between the first gate metal layer 01 and the first source-drain metal layer 02 is provided with a first opening therein. The first opening 11 may be used to expose the first end 11 of the first conductive coil 10 located in the first gate metal layer 01, so that the first end 31 of the second conductive coil 30 located in the first source-drain metal layer 02 is electrically connected to the first end 11 of the first conductive coil 10 located in the first gate metal layer 01 through the first opening.

For the case that the second end 12 of the first conductive coil 10 is electrically connected to the second end 32 of the second conductive coil 32, the description will be made below.

As shown in FIG. 6, the second end 12 of the first conductive coil 10 includes a first sub-portion G1 and a second sub-portion G2. The first sub-portion G1 is also used as the control electrode c1 of the P-type transistor T1, and the second sub-portion G2 is also used as the control electrode c2 of the N-type transistor T2.

Based on this, on the basis that the first sub-portion G1 of the second end 12 of the first conductive coil 10 is also used as the control electrode c1 of the P-type transistor T1, and the second sub-portion G2 is also used as the control electrode c2 of the N-type transistor T2, it is possible to set the second end 32 of the second conductive coil 30 to be electrically connected to the control electrode c2 of the N-type transistor T2, so that the second end 12 of the first conductive coil 10 is electrically connected to the second end 32 of the second conductive coil 30.

With continued reference to FIG. 16, the first interlayer dielectric layer 07 between the first gate metal layer 01 and the first source-drain metal layer 02 is further provided with a second opening therein, and the second opening may be used to expose the control electrode c2 of the N-type transistor T2 located in the first gate metal layer 01, so that the second end 32 of the second conductive coil 30 located in the first source-drain metal layer 02 is electrically connected to the control electrode c2 of the N-type transistor T2 located in the first gate metal layer 01 through the second opening.

In some examples, the first interlayer dielectric layer 07 between the first gate metal layer 01 and the first source-drain metal layer 02 may further be provided with a third opening therein, and the third opening is used to expose the control electrode c1 of the P-type transistor T1 in the first gate metal layer 01, so that the second end 32 of the second conductive coil 30 located in the first source-drain metal layer 02 is electrically connected to the control electrode c1 of the P-type transistor T1 located in the first gate metal layer 01 through the third opening.

For the case that the first end 11 of the first conductive coil 10 is further electrically connected to the second electrode P2 of the light-emitting unit E, the description will be made below.

Referring to FIG. 16, the first end 31 of the second conductive coil 30 is located between the first end 11 of the first conductive coil 10 and the second electrode P2 of the light-emitting unit E. Therefore, the second electrode P2 of the light-emitting unit E may be set to be electrically connected to the first end 11 of the first conductive coil 10 through the first end 31 of the second conductive coil 30, so that the first conductive coil 10, which is convenient to connect both the first conductive coil 10 and the second conductive coil 30 to the light-emitting unit E.

In some examples, the planarization layer 08 located between the first electrode metal layer 03 and the first source-drain metal layer 02 may be provided with a fourth opening therein. The fourth opening may be used to expose the first end 31 of the second conductive coil 30 located in the first source-drain metal layer 02, so that the second electrode P2 of the light-emitting unit E located in the first electrode metal layer 03 is electrically connected to the first end 31 of the second conductive coil 30 located in the first source-drain metal layer 02 through the fourth opening. Thus, both the first conductive coil 10 and the second conductive coil 30 are electrically connected to the light-emitting unit E.

Based on this, a segmented punching design (the first opening and the fourth opening being provided) is used to realize that the first end 11 of the first conductive coil 10 is electrically connected to the second electrode P2 of the light-emitting unit E, compared with a case that only one connection hole is provided between the first end 11 of the first conductive coil 10 and the second electrode P2 of the light-emitting unit E, it is possible to effectively reduce the depth of the through hole, which is beneficial to reducing the problem of poor contact of the through hole and is beneficial to reducing the difficulty of punching process.

It will be noted that, except for the above description, other structures of the light-emitting substrate 100 shown in FIG. 16 are similar to that of the light-emitting substrate 100 shown in FIG. 11, and reference may be made to the description of the position of the light-emitting substrate 100 shown in FIG. 11.

In conclusion, some of the embodiments of the present disclosure provide the light-emitting substrate 100 and the light-emitting apparatus 200. The light-emitting apparatus 200 includes the light-emitting substrate 100. The light-emitting substrate 100 includes the first conductive coil 10, the control circuit 20 and the light-emitting unit E. The control circuit is connected in series between the first conductive coil 10 and the light-emitting unit E, and the first power signal generated by the first conductive coil 10 may be used to drive the control circuit to be turned on; the control circuit 20 may transmit the first voltage signal V2 provided by the first power terminal V to the light-emitting unit E to enable the light-emitting unit E to emit light. Based on this, the light-emitting substrate 100 may integrate the first conductive coil 10 and the light-emitting unit E on a same substrate, i.e., may integrate NFC wireless communication and display on one substrate.

In addition, the light-emitting substrate 100 may also use the first conductive coil 10 to supply power to the light-emitting unit E to drive the light-emitting unit E to perform light-emitting display. Furthermore, the light-emitting substrate 100 may not need to be provided with a power source to supply power to the light-emitting unit, and the light-emitting substrate 100 capable of being passively driven by electromagnetic induction, which may be conducive to simplifying the structure of the light-emitting substrate 100, and conducive to the lightness and thinness of the light-emitting substrate 100.

On this basis, since the light-emitting apparatus 200 includes the light-emitting substrate 100 in any of the above embodiments, the light-emitting apparatus 200 has all the beneficial effects described above for the light-emitting substrate 100.

The above are only specific embodiments of the present disclosure, but the scope of protection of the present disclosure is not limited thereto, and any person skilled in the art may conceive of variations or replacements within the technical scope of the present disclosure, which shall fall within the protection scope of the present disclosure. Therefore, the protection scope of the present disclosure should be determined by the protection scope of the claims.

What is claimed is:

1. A light-emitting substrate, comprising:
a first conductive coil having a first end and a second end, the first conductive coil being used to couple to an external coil, so that the first conductive coil generates a first power signal;
a light-emitting unit including a first electrode and a second electrode, the second electrode of the light-emitting unit being electrically connected to the first end of the first conductive coil; and
a control circuit, a control terminal of the control circuit being electrically connected to the second end of the first conductive coil, an input terminal of the control circuit being electrically connected to a first power terminal, and an output end of the control circuit being electrically connected to the first electrode of the light-emitting unit; wherein a first voltage signal provided by the first power terminal is a direct current voltage signal;
wherein the control circuit is configured to transmit the first voltage signal received at the first power terminal to the light-emitting unit under control of the first power signal from the first conductive coil, so that the light-emitting unit emits light.

2. The light-emitting substrate according to claim 1, wherein the control circuit includes:
a first control unit, a control terminal of the first control unit and the first conductive coil being electrically connected to a first node, an input terminal of the first control unit being electrically connected to the first power terminal, an output terminal of the first control unit being electrically connected to a second node; and
a second control unit, a control terminal of the second control unit and the first conductive coil being electrically connected to the first node, an input terminal of the second control unit being electrically connected to the first power terminal, and an output terminal of the second control unit being electrically connected to the second node;

wherein the first node serves as the control terminal of the control circuit, and the second node serves as the output terminal of the control circuit.

3. The light-emitting substrate according to claim 2, wherein the first control unit includes a P-type transistor, and the second control unit includes an N-type transistor.

4. The light-emitting substrate according to claim 3, further comprising:
a base substrate;
a first gate metal layer located on a side of the base substrate, the first gate metal layer including a control electrode of the P-type transistor and a control electrode of the N-type transistor;
a first source-drain metal layer located on a side of the first gate metal layer away from the base substrate, the first source-drain metal layer including a first electrode of the P-type transistor, a second electrode of the P-type transistor, a first electrode of the N-type transistor, and a second electrode of the N-type transistor;
a first electrode metal layer located on a side of the first source-drain metal layer away from the base substrate; and
a second electrode metal layer located on a side of the first electrode metal layer away from the base substrate;
wherein of the first electrode of the light-emitting unit and the second electrode of the light-emitting unit, one is located in the first electrode metal layer, and another is located in the second electrode metal layer.

5. The light-emitting substrate according to claim 4, wherein a voltage value of the first voltage signal is greater than 0 V;
the first electrode of the light-emitting unit is located in the first electrode metal layer, and the second electrode of the light-emitting unit is located in the second electrode metal layer.

6. The light-emitting substrate according to claim 5, wherein the voltage value of the first voltage signal is in a range of 2 V to 5 V, inclusive.

7. The light-emitting substrate according to claim 5, wherein the first electrode metal layer further includes a first connection portion; the first end of the first conductive coil is electrically connected to the second electrode of the light-emitting unit through the first connection portion.

8. The light-emitting substrate according to claim 4, wherein a voltage value of the first voltage signal is less than 0 V;
the first electrode of the light-emitting unit is located in the second electrode metal layer, and the second electrode of the light-emitting unit is located in the first electrode metal layer.

9. The light-emitting substrate according to claim 8, wherein the voltage value of the first voltage signal is in a range of −5 V to −2 V, inclusive.

10. The light-emitting substrate according to claim 8, wherein the first electrode metal layer further includes a second connection portion, the second electrode of the P-type transistor and the second electrode of the N-type transistor are electrically connected to the first electrode of the light-emitting unit through the second connection portion.

11. The light-emitting substrate according to claim 4, wherein the first conductive coil is located in one of the first gate metal layer e and the first source-drain metal layer.

12. The light-emitting substrate according to claim 4, further comprising a second conductive coil connected to the first conductive coil in parallel.

13. The light-emitting substrate according to claim 12, wherein an orthographic projection of the first conductive coil on the base substrate overlaps at least partially with an orthographic projection of the second conductive coil on the base substrate.

14. The light-emitting substrate according to claim 12, wherein of the first conductive coil and the second conductive coil, one is located in the first gate metal layer and another is located in the first source-drain metal layer.

15. The light-emitting substrate according to claim 1, wherein a thickness of the first conductive coil is greater than or equal to 1 μm.

16. The light-emitting substrate according to claim 1, wherein a number of turns of the first conductive coil is greater than or equal to 10.

17. The light-emitting substrate according to claim 1, wherein a line width of the first conductive coil is greater than or equal to 500 μm.

18. The light-emitting substrate according to claim 1, wherein the first conductive coil includes a plurality of turns of conductive lines, a first minimum distance between two adjacent turns of conductive lines is greater than or equal to 10 μm.

19. The light-emitting substrate according to claim 1, wherein the light-emitting unit includes a light-emitting diode.

20. A light-emitting apparatus, comprising the light-emitting substrate according to claim 1.

* * * * *